(12) United States Patent
Ishiguro

(10) Patent No.: US 11,817,346 B2
(45) Date of Patent: Nov. 14, 2023

(54) ISOLATOR

(71) Applicants: Kabushiki Kaisha Toshiba, Tokyo (JP); Toshiba Electronic Devices & Storage Corporation, Tokyo (JP)

(72) Inventor: Akira Ishiguro, Oita Oita (JP)

(73) Assignees: Kabushiki Kaisha Toshiba, Tokyo (JP); Toshiba Electronic Devices & Storage Corporation, Tokyo (JP)

( * ) Notice: Subject to any disclaimer, the term of this patent is extended or adjusted under 35 U.S.C. 154(b) by 0 days.

(21) Appl. No.: 17/181,147

(22) Filed: Feb. 22, 2021

(65) Prior Publication Data

US 2022/0076990 A1   Mar. 10, 2022

(30) Foreign Application Priority Data

Sep. 10, 2020 (JP) ................................. 2020-152253

(51) Int. Cl.
  *H01L 21/762* (2006.01)
  *H01L 21/28* (2006.01)

(52) U.S. Cl.
  CPC .. *H01L 21/76232* (2013.01); *H01L 21/28052* (2013.01); *H01L 21/76243* (2013.01)

(58) Field of Classification Search
  CPC . H01L 28/10; H01L 23/5227; H01L 27/0288; H01L 27/0629–0635; H01L 27/0647–0658; H01L 27/067–0682; H01L 27/0711–0738; H01L 27/0755; H01L 27/0772–0794; H01L 27/0802–0811; H01L 27/1255; H01L 29/0649–0653; H01L 2221/1042–1047; H01L 29/4991; H01L 29/515
  See application file for complete search history.

(56) References Cited

U.S. PATENT DOCUMENTS

| | | | | |
|---|---|---|---|---|
| 7,642,619 B2* | 1/2010 | Matz | ................... | H01L 23/5222 |
| | | | | 257/528 |
| 8,552,821 B2 | 10/2013 | Nagai | | |
| 2008/0061631 A1 | 3/2008 | Fouquet et al. | | |
| 2011/0128091 A1 | 6/2011 | Fujiwara et al. | | |
| 2015/0287677 A1 | 10/2015 | Lan et al. | | |
| 2021/0028103 A1* | 1/2021 | Huang | ................ | H01L 23/5222 |

FOREIGN PATENT DOCUMENTS

| | | |
|---|---|---|
| CN | 106165094 A | 11/2016 |
| JP | 2011-114828 A | 6/2011 |
| JP | 5377778 B2 | 12/2013 |
| JP | 2016-006816 A | 1/2016 |

* cited by examiner

*Primary Examiner* — Julio J Maldonado
*Assistant Examiner* — Stanetta D Isaac
(74) *Attorney, Agent, or Firm* — Allen & Overy LLP

(57) ABSTRACT

An isolator includes a first insulating portion, a first electrode provided in the first insulating portion, a second insulating portion provided on the first insulating portion and the first electrode, a third insulating portion provided on the second insulating portion, and a second electrode provided in the third insulating portion. The second insulating portion includes a plurality of first voids and a second void. The plurality of first voids are arranged in a first direction parallel to an interface between the first insulating portion and the second insulating portion. At least one of the first voids is provided under the second void.

18 Claims, 22 Drawing Sheets

ISOLATOR

CROSS-REFERENCE TO RELATED APPLICATIONS

This application is based upon and claims the benefit of priority from Japanese Patent Application No. 2020-152253, filed on Sep. 10, 2020; the entire contents of which are incorporated herein by reference.

FIELD

Embodiments relate to an isolator.

BACKGROUND

An isolator transmits a signal by utilizing the change of a magnetic field or an electric field under blocking the current. In such an isolator, for example, it is desirable to prevent dielectric breakdown between two magnetically coupled coils by providing a thick insulating body between the coils. However, when the insulating body is thick, there may be cases where internal stress becomes large and makes cracks and/or warp of the wafer.

DETAILED DESCRIPTION

According to one embodiment, an isolator includes a first insulating portion, a first electrode provided in the first insulating portion, a second insulating portion provided on the first insulating portion and the first electrode, a third insulating portion provided on the second insulating portion, and a second electrode provided in the third insulating portion. The second insulating portion includes a plurality of first voids and a second void. The plurality of first voids are arranged in a first direction parallel to an interface between the first insulating portion and the second insulating portion. At least one of the first voids is provided under the second void.

Embodiments will now be described with reference to the drawings. The same portions inside the drawings are marked with the same numerals; a detailed description is omitted as appropriate; and the different portions are described. The drawings are schematic and conceptual; and the relationships between the thicknesses and widths of portions, the proportions of sizes between portions, etc., are not necessarily the same as the actual values thereof. The dimensions and/or the proportions may be illustrated differently between the drawings, even in the case where the same portion is illustrated.

First Embodiment

Figure 1:
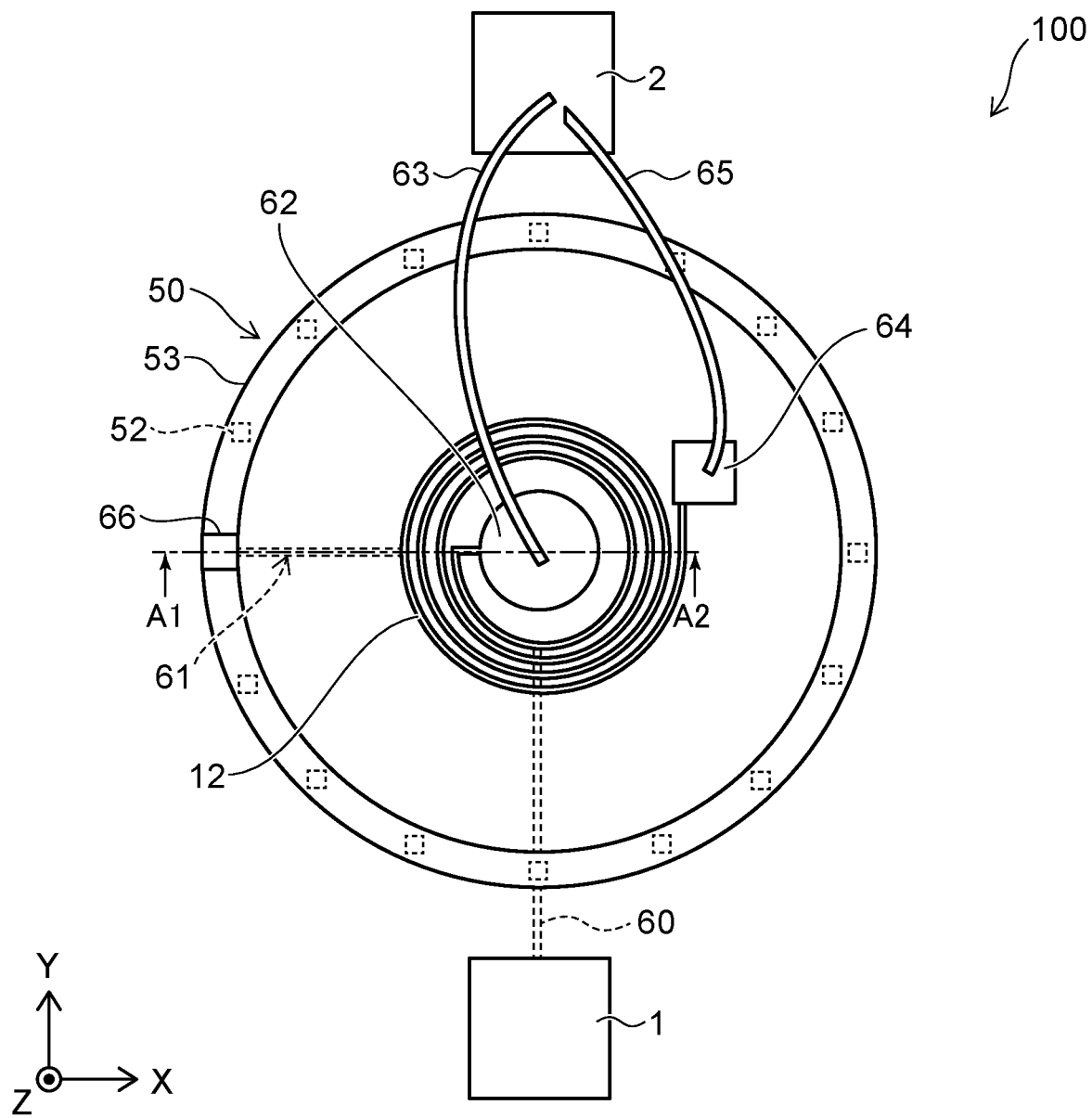
FIG. 1 is a plan view illustrating an isolator, and circuits according to a first embodiment.

FIG. 1 is a plan view illustrating an isolator 100 according to a first embodiment.

Figure 2:
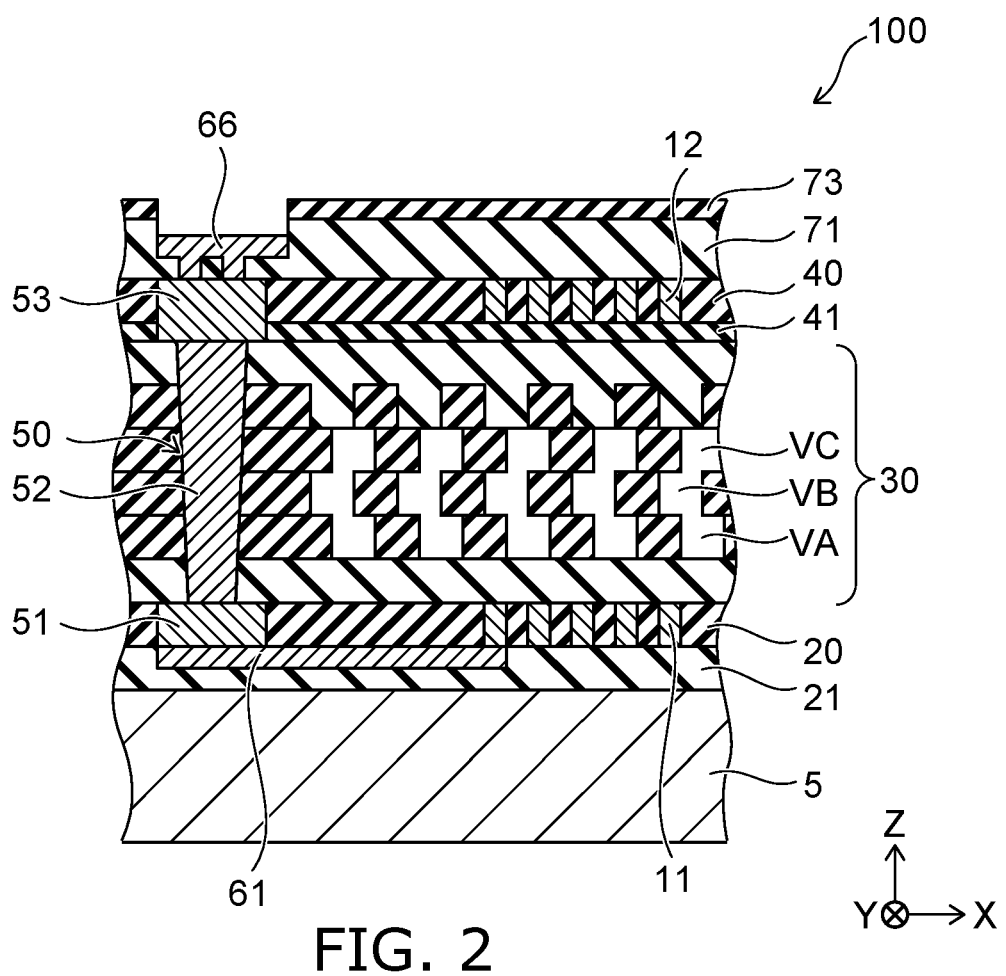
FIG. 2 is a schematic cross-sectional view illustrating the isolator according to the first embodiment.

FIG. 2 is a schematic cross-sectional view illustrating the isolator 100 according to the first embodiment. FIG. 2 is a cross-sectional view along line A1-A2 in FIG. 1.

For example, the first embodiment relates to a device called a digital isolator, a galvanic isolator, or a galvanic isolation element. As shown in FIGS. 1 and 2, the isolator 100 according to the first embodiment includes a first circuit 1, a second circuit 2, a substrate 5, a first electrode 11, a second electrode 12, a first insulating portion 20, an insulating film 21, a second insulating portion 30, a third insulating portion 40, an insulating film 41, an insulating film 71, an insulating film 73, and a conductive body 50. The insulating films 71 and 73 are not illustrated in FIG. 1 to illustrate the configuration of the second electrode 12.

An XYZ orthogonal coordinate system is used in the description of the embodiments. The direction from the first electrode 11 toward the second electrode 12 is taken as a Z-direction (a first direction). Two mutually-orthogonal directions perpendicular to the Z-direction are taken as an X-direction (a second direction) and a Y-direction (a third direction). In the description, the direction from the first electrode 11 toward the second electrode 12 is called "up", and the reverse direction is called "down". These directions illustrate the relative positional relationship between the first electrode 11 and the second electrode 12 and are not limited to vertical directions based on gravity.

As shown in FIG. 2, the first insulating portion 20 is provided on the substrate 5. The first electrode 11 is provided in the first insulating portion 20, The insulating film 21 is provided between the substrate 5 and the first insulating portion 20. The insulating film 21 is a so-called inter-layer insulating film.

The second insulating portion 30 is provided on the first electrode 11 and the first insulating portion 20. The second electrode 12 is provided on the second insulating portion 30. The second insulating portion 30 includes, for example, voids VA, VB, and VC. The voids VA, VB, and VC each are arranged in a direction (e.g., the X-direction) along the interface between the first insulating portion 20 and the second insulating portion 30. Also, the voids VA, VB, and VC are arranged in the Z-direction and communicate with each other.

The third insulating portion 40 is provided on the second insulating portion 30, The second electrode 12 is provided in the third insulating portion 40. The insulating film 41 is provided between the second insulating portion 30 and the third insulating portion 40. For example, the lower end of the second electrode 12 contacts the insulating film 41.

The first insulating portion 20, the second insulating portion 30, and the third insulating portion 40 include, for example, silicon and oxygen. The first insulating portion 20, the second insulating portion 30, and the third insulating portion 40 include, for example, silicon oxide or silicon oxynitride. The insulating film 21 is, for example, a silicon oxide film. The insulating film 41 is, for example, a silicon nitride film.

In the example illustrated in FIGS. 1 and 2, the first electrode 11 and the second electrode 12 are, for example, planar coils. The first electrode 11 and the second electrode 12 are provided in, for example, spiral configurations along the X-Y plane parallel to the front surface of the substrate 5. The first electrode 11 and the second electrode 12 are provided at positions facing each other in the Z-direction. At least a portion of the second electrode 12 is arranged with at least a portion of the first electrode 11 in the Z-direction.

The first electrode 11, the second electrode 12, and the conductive body 50 include, for example, metals. The first electrode 11 and the second electrode 12 include, for example, copper or aluminum. The first electrode 11 and the second electrode 12 include materials having low electrical resistances to suppress heat generation in the signal transmission. For example, it is preferable for the first electrode 11 and the second electrode 12 to include copper or a copper alloy.

As shown in FIG. 2, the insulating film 71 and the insulating film 73 are stacked on the second electrode 12 and the third insulating portion 40. The insulating film 71 is provided between the third insulating portion 40 and the insulating film 73. For example, the insulating film 71 contacts the second electrode 12 and the third insulating portion 40. The insulating film 71 is, for example, a silicon oxide film. The insulating film 73 includes, for example, an insulating resin such as polyimide, polyamide, etc.

The conductive body 50 is provided to surround the first electrode 11 and the second electrode 12 along the X-Y plane. The conductive body 50 includes, for example, a metal. The conductive body 50 includes, for example, copper or aluminum. The conductive body 50 includes, for example, a first conductive portion 51, a second conductive portion 52, and a third conductive portion 53.

The first conductive portion 51 is provided to surround the first electrode 11 along the X-Y plane. The first conductive portion 51 is provided in the first insulating portion 20.

The second conductive portion 52 is provided on the first conductive portion 51. Multiple second conductive portions 52 are arranged along the upper surface of the first conductive portion 51. The second conductive portions 52 each extend in the Z-direction. The lower ends of the second conductive portions 52 contact the first conductive portion 51.

The third conductive portion 53 is provided on the second conductive portions 52. The third conductive portion 53 is provided in the third insulating portion 40 and surrounds the second electrode 12 along the X-Y plane. The upper ends of the second conductive portions 52 contact the third conductive portion 53.

In the example shown in FIG. 1, one end of the coil-shaped first electrode 11 is electrically connected to the first circuit 1 via wiring 60. The other end of the first electrode 11 is electrically connected to the conductive body 50 via wiring 61. For example, the wiring 61 is provided between the first insulating portion 20 and the insulating film 21.

One end of the coil-shaped second electrode 12 is electrically connected to the second circuit 2 via a metal layer 62 and wiring 63, The other end of the second electrode 12 (the other end of the coil) is electrically connected to the second circuit 2 via a metal layer 64 and wiring 65. For example, the metal layer 62 is provided on the one end of the second electrode 12 (referring to FIG. 5C). The metal layer 64 is provided on the other end of the second electrode 12. For example, the metal layer 62 and the metal layer 64 are positioned in the Z-direction at a higher level than a level of the second electrode 12. The metal layers 62 and 64 are linked to the second electrode 12. The embodiment is not limited to the example. For example, the second electrode 12 and the metal layers 62 and 64 may be simultaneously formed and may be positioned at the same level in the Z-direction.

As shown in FIG. 2, a metal layer 66 is provided on the conductive body 50, and is electrically connected to the conductive body 50. For example, the metal layer 66 is provided in the insulating film 71. For example, the conductive body 50 is electrically connected to another conductive member (not illustrated) via a metal wire bonded to the metal layer 66. For example, the conductive body 50 and the substrate 5 are connected to a reference potential. The reference potential is, for example, a ground potential.

The substrate 5 may include an electrical circuit connected to the first electrode 11, For example, the electrical circuit includes multiple transistors (not illustrated) that are provided at the front side of the substrate 5 contacting the insulating film 21, and wiring (not illustrated) that is provided in the insulating film 21 and electrically connects the multiple transistors. The substrate 5 is, for example, a conductive silicon substrate. The silicon substrate includes at least one impurity selected from the group consisting of boron, phosphorus, arsenic, and antimony. The substrate 5 may be a high-resistance silicon substrate.

For example, the first circuit 1 is a portion of the electrical circuit provided on the substrate 5. The conductive body 50 is provided on the substrate 5, For example, the first circuit 1 may be positioned at the inner side of the conductive body 50 when viewed from the Z-direction. The first circuit 1 is shielded by the conductive body 50 from electromagnetic waves directed toward the substrate 5 from outside the substrate 5 and the conductive body 50. Thus, the first circuit 1 can operate further stably.

One of the first circuit 1 or the second circuit 2 shown in FIG. 1 serves as a transmitting circuit. The other of the first circuit 1 or the second circuit 2 serves as a receiving circuit. In the description herein, the first circuit 1 is a transmitting circuit, and the second circuit 2 is a receiving circuit.

For example, the first circuit 1 transmits, to the first electrode 11, a signal (an electric current) that has a waveform suited to the transmission between the coils. When the electric current flows in the first electrode 11, a magnetic field is generated which passes through the spiral-shaped electrode. The first electrode hand the second electrode 12 are arranged so that at least portions thereof overlap each other in the Z-direction; and at least a portion of the magnetic force lines generated in the first electrode 11 passes through the second electrode 12. The change of the magnetic force lines in the second electrode 12 induces an electromotive force in the second electrode 12; and an electric current flows in the second electrode 12, The second circuit 2 detects the electric current flowing in the second electrode 12 and generates a signal corresponding to the detection result, Thereby, the signal can be transmitted without an electric current passing between the first electrode 11 and the second electrode 12.

In the isolator 100, the voids VA, VB and VC provided in the second insulating portion 30 reduce the stress in the insulating body which is included in the second insulating portion 30. For example, even when an insulating body is interposed between the first electrode 11 and the second electrode 12, which has a thickness in the Z-direction of not less than 8 micrometers (μm) to ensure the desired breakdown voltage, the stress in the insulating body can be reduced by the voids VA, VB, and VC; and the insulating body can be prevented from cracking and like. The warp of the wafer also can be suppressed in the manufacturing processes of the isolator 100.

A method for manufacturing the isolator 100 according to the first embodiment will now be described with reference to FIGS. 3A to 5C. FIGS. 3A to 5C are cross-sectional views illustrating manufacturing processes of the isolator 100. FIGS. 3A to 5C are schematic views corresponding to a cross section along line A1-A2 in FIG. 1.

Figure 3A:
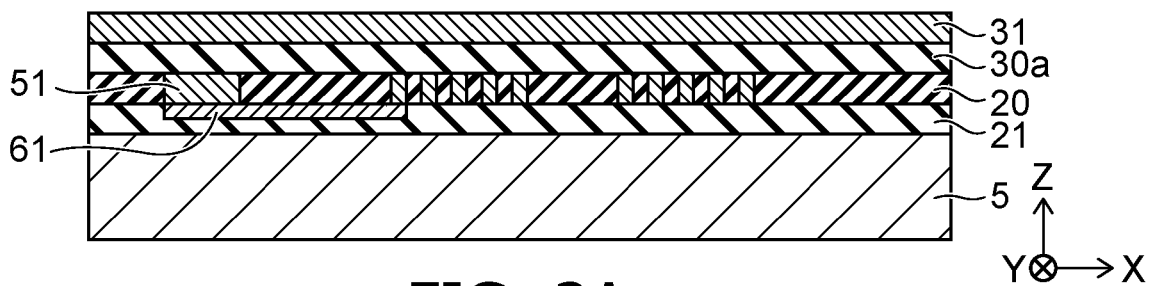
FIGS. 3A to 5C are cross-sectional views illustrating manufacturing processes according to the first embodiment.

As shown in FIG. 3A, the insulating film 21 and the first insulating portion 20 are formed on the substrate 5 by chemical vapor deposition (hereinbelow, CVD); subsequently, the first electrode 11 and the first conductive portion 51 are formed in the first insulating portion 20. For example, the first electrode 11 and the first conductive portion 51 are formed by filling a metal layer into trenches formed by selectively removing the first insulating portion 20.

Before the first insulating portion 20 is formed, the wiring 61 is embedded in a trench formed in the insulating film 21, The wiring 61 is formed to electrically connect the first conductive portion 51 and one end of the first electrode 11 at the outer side. The wiring 61 is, for example, a metal including copper.

An insulating film 30a is formed to cover the first electrode 11, the first insulating portion 20, and the first conductive portion 51. Continuing, a first sacrificial film 31 is formed on the insulating film 30a. The insulating film 30a is, for example, a silicon oxide film formed by CVD. The first sacrificial film 31 is, for example, an amorphous carbon film formed using CVD.

Figure 3B:
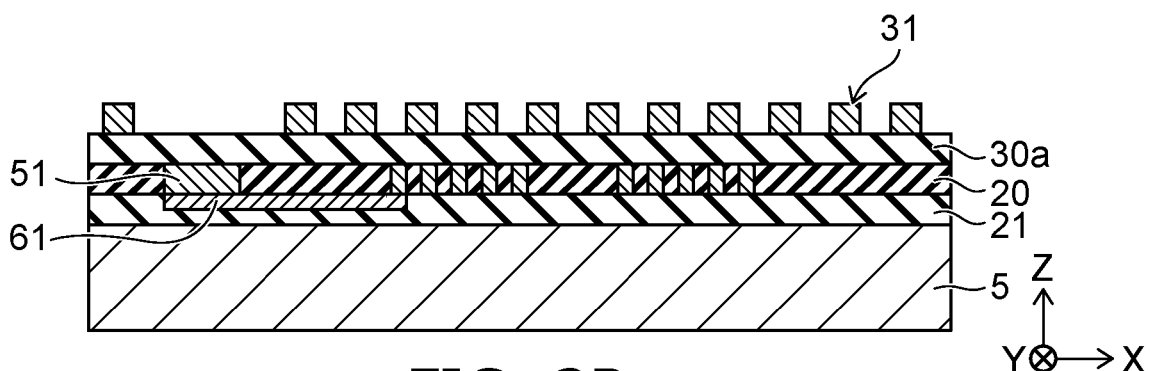

As shown in FIG. 3B, the first sacrificial film 31 is patterned into a prescribed configuration. For example, the first sacrificial film 31 is selectively removed after an etching mask (not-illustrated) is formed using photolithography. For example, the first sacrificial film 31 is removed by dry etching.

Figure 3C:
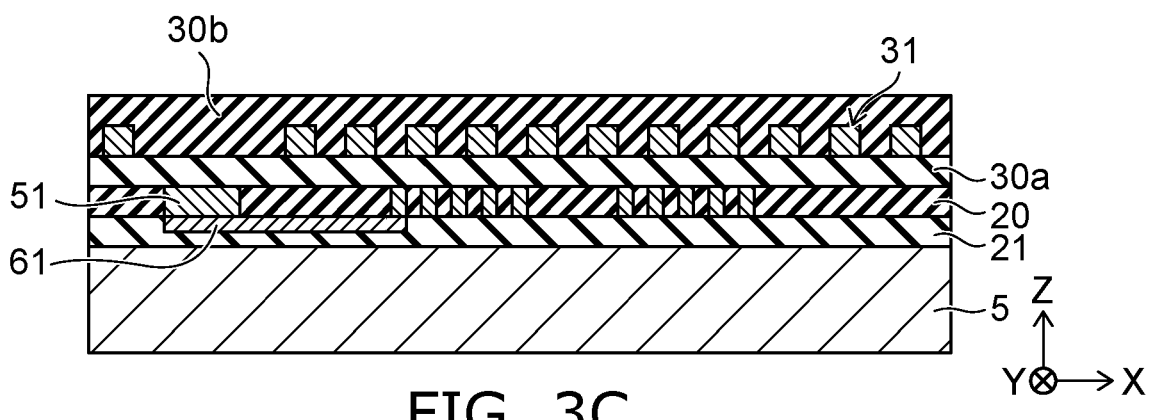

As shown in FIG. 3C, an insulating film 30b is formed on the insulating film 30a to cover the first sacrificial film 31. The insulating film 30b is, for example, a silicon oxide film formed using CVD.

Figure 3D:
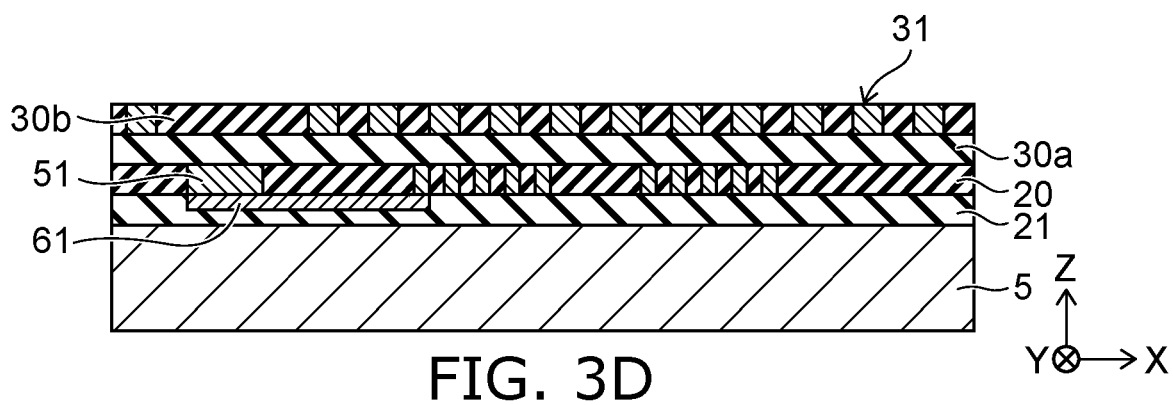

As shown in FIG. 3D, the insulating film 30b is removed so that the portions of the insulating film 30b remain which are formed between the portions of the first sacrificial film 31 that are next to each other. For example, the insulating film 30b is removed by isotropic dry etching or CMP (Chemical Mechanical Polishing).

Figure 4A:
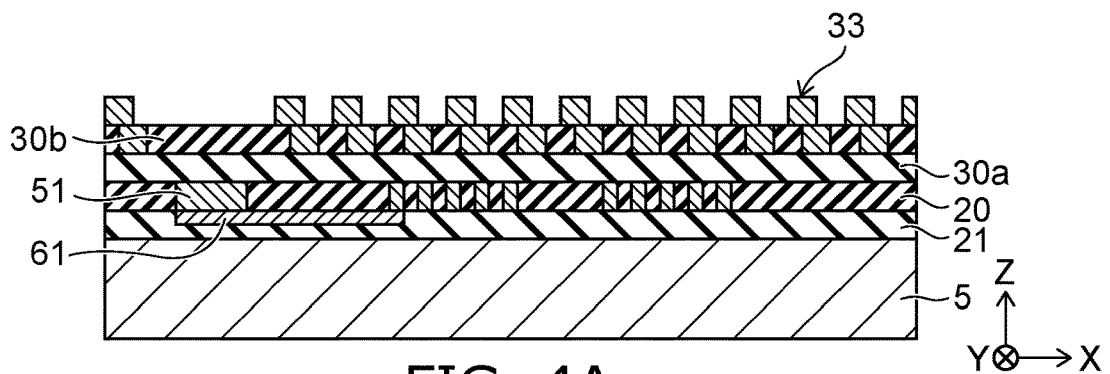

As shown in FIG. 4A, a second sacrificial film 33 is formed on the insulating film 30b and the first sacrificial film 31. The second sacrificial film 33 is patterned into a prescribed configuration after being formed to cover the insulating film 30b and the first sacrificial film 31, The second sacrificial film 33 is, for example, an amorphous carbon film.

The second sacrificial film 33 is formed so that the second sacrificial film 33 includes a portion positioned on the first sacrificial film 31 and contacts the first sacrificial film 31. The second sacrificial film 33 is selectively removed using, for example, dry etching. The etching of the second sacrificial film 33 is performed using, for example, an etching mask (not-illustrated) and is stopped when the insulating film 30b is exposed.

Figure 4B:
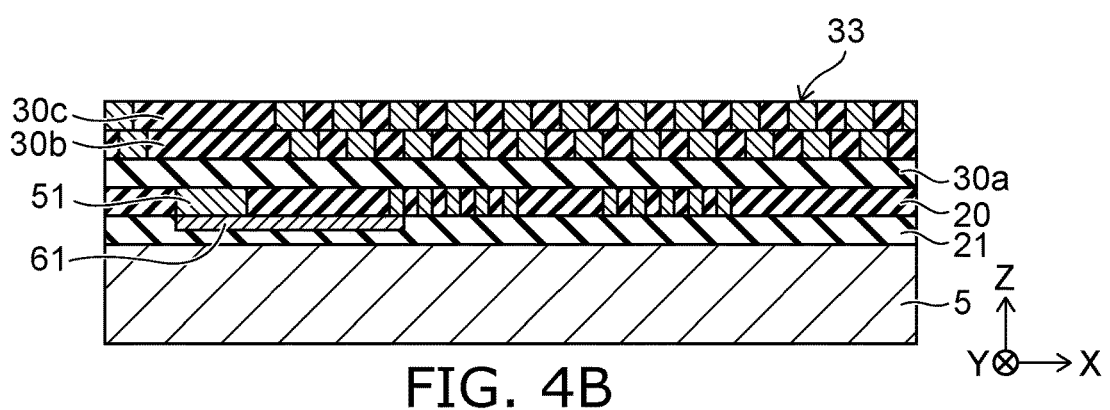

As shown in FIG. 4B, an insulating film 30c is formed between the portions of the second sacrificial film 33 that are next to each other. The insulating film 30c is, for example, a silicon oxide film formed by CVD. The insulating film 30c is formed by the same procedure as the insulating film 30b.

Figure 4C:
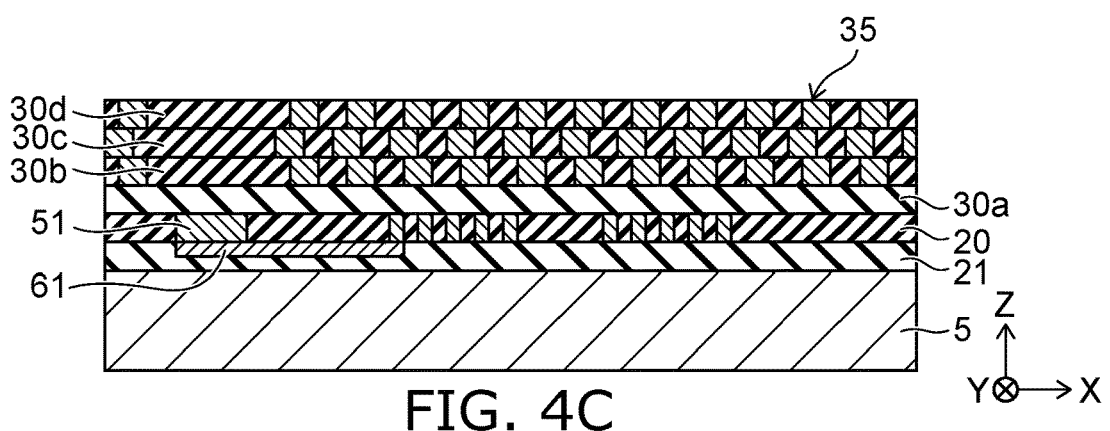

As shown in FIG. 4C, an insulating film 30d and a third sacrificial film 35 are formed on the insulating film 30c and the second sacrificial film 33. The third sacrificial film 35 is formed so that the third sacrificial film 35 includes a portion positioned on the second sacrificial film 33.

The insulating film 30d and the third sacrificial film 35 are formed by the same procedure as the insulating film 30c and the second sacrificial film 33. The insulating film 30d is, for example, a silicon oxide film; and the third sacrificial film 35 is, for example, an amorphous carbon film.

Figure 4D:
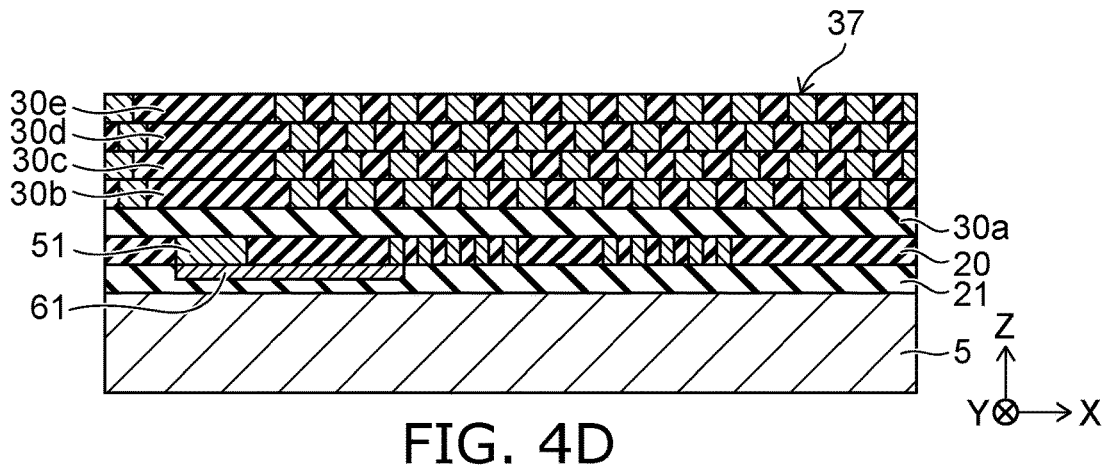

As shown in FIG. 4D, an insulating film 30e and a fourth sacrificial film 37 are formed on the insulating film 30d and the third sacrificial film 35. The fourth sacrificial film 37 is formed so that the fourth sacrificial film 37 includes a portion positioned on the third sacrificial film 35.

The insulating film 30e and the fourth sacrificial film 37 are formed by the same procedure as the insulating film 30c and the second sacrificial film 33. The insulating film 30e is, for example, a silicon oxide film; and the fourth sacrificial film 37 is, for example, an amorphous carbon film.

Figure 5A:
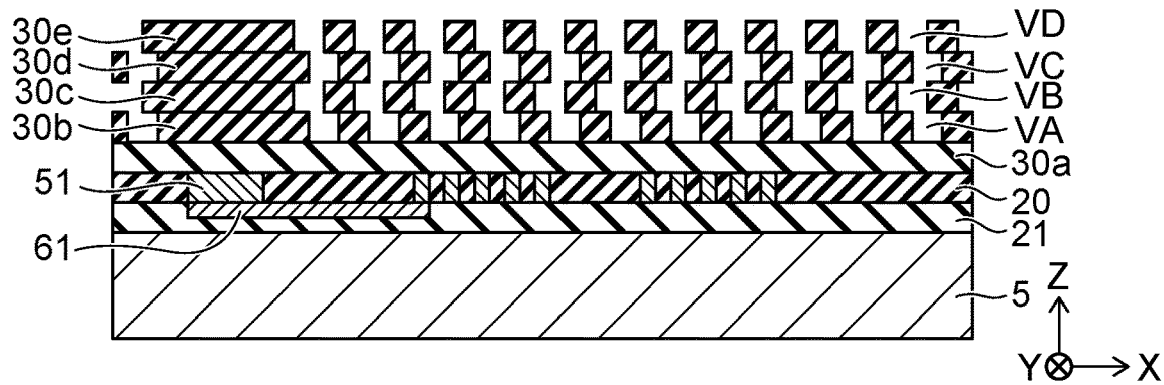

As shown in FIG. 5A, the first sacrificial film 31, the second sacrificial film 33, the third sacrificial film 35, and the fourth sacrificial film 37 are selectively removed. For example, the first sacrificial film 31, the second sacrificial film 33, the third sacrificial film 35, and the fourth sacrificial film 37 are removed by oxygen asking. Thereby, the voids VA, VB, VC, and VD are formed respectively in the insulating films 30b, 30c, 30d, and 30e. The voids VA, VB, VC, and VD communicate with each other. In other words, the voids communicate with each other between the void VA and the void VB, between the void VB and the void VC, and between the void VC and the void VD. For example, the void VA and the void VC have the same configuration, and the void VB and the void VD have the same configuration. The first sacrificial film 31, the second sacrificial film 33, the third sacrificial film 35, and the fourth sacrificial film 37 are not formed where the second conductive portion 52 is to be provided (referring to FIGS. 1 and 2).

Figure 5B:
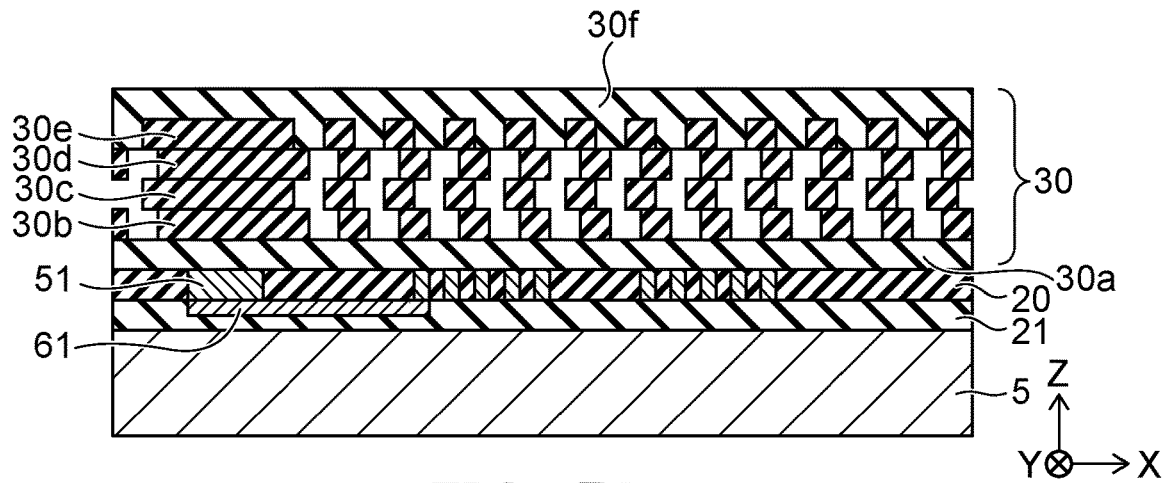

As shown in FIG. 5B, an insulating film 30f is formed to cover the insulating film 30e, The insulating film 30f is, for example, a silicon oxide film formed using CVD. The insulating film 30f is formed to fill the void VD of the insulating film 30e.

For example, the portion at which the void VC and the void VD communicate with each other is plugged at the initial stage of the formation process of the insulating film 30f. Therefore, the insulating film 30f is formed so that the void VA, the void VB, and the void VC remain respectively inside the insulating films 30b, 30c, and 30d.

Thus, the second insulating portion 30 is formed on the first insulating portion 20. The second insulating portion 30 includes the insulating films 30a to 30f and includes the voids VA, VB, and VC inside the insulating films 30a to 30f.

Figure 5C:
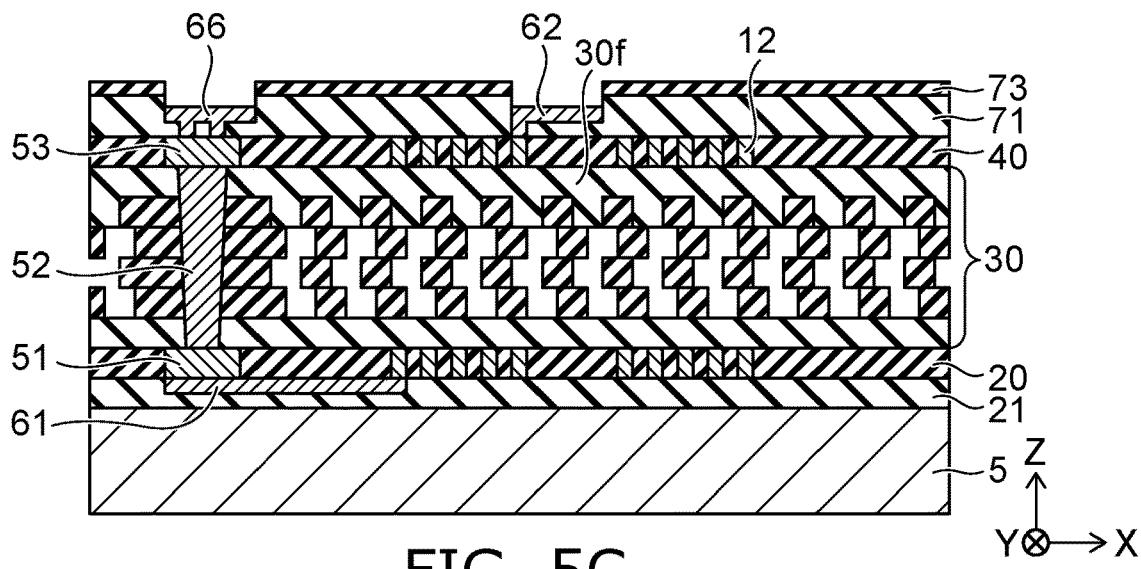

As shown in FIG. 5C, after the second conductive portion 52 is formed in the second insulating portion 30, the third insulating portion 40 is formed on the second insulating portion 30 and the second conductive portion 52. The second electrode 12 and the third conductive portion 53 are formed in the third insulating portion 40.

The second conductive portion 52 is formed inside a contact hole that extends in the Z-direction through the second insulating portion 30 to communicate with the first conductive portion 51, The second electrode 12 and the third conductive portion 53 are formed inside trenches provided in the third insulating portion 40. The insulating film 41 may be formed between the second insulating portion 30 and the third insulating portion 40. The insulating film 41 serves as an etching stopper when the trenches are formed in the third insulating portion 40.

Continuing, the insulating film 71 is formed on the third insulating portion 40. The insulating film 71 is, for example, a silicon oxide film formed using CVD. The insulating film 71 has a multilayer structure (not-illustrated), and the metal layers 62 and 64 (referring to FIG. 1) and the metal layer 66 are provided in the insulating film 71, The insulating film 73 is formed on the insulating film 71. For example, the insulating film 73 is used as an etching mask for exposing the surfaces of the metal layers 62 and 66. The insulating film 73 is, for example, a resin film including polyimide, polyamide, etc.

Figure 6A:
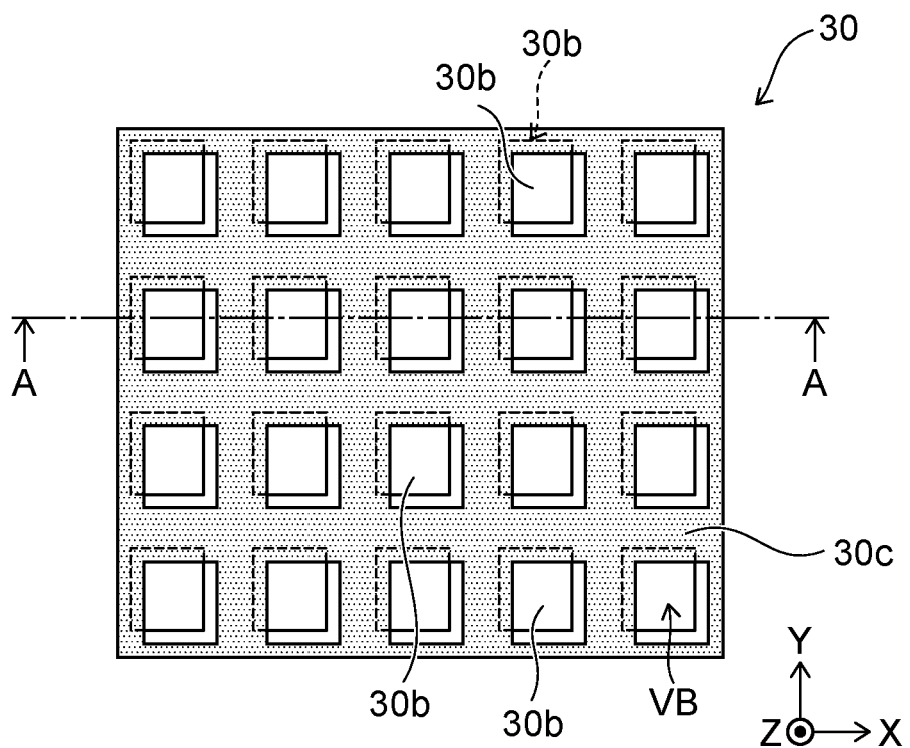
FIGS. 6A and 6B are schematic views illustrating a structure of an insulating portion according to the first embodiment.
Figure 6B:
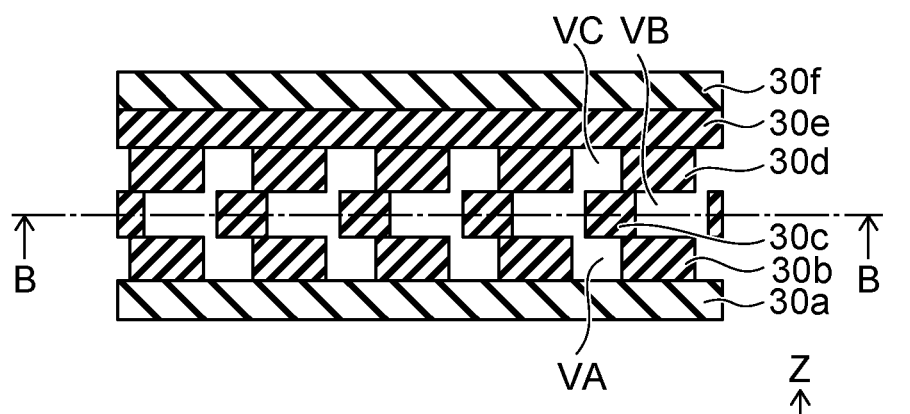

FIGS. 6A and 6B are schematic views illustrating a structure of the second insulating portion 30 according to the first embodiment. FIG. 6A is a plan view showing a cross section along line B-B shown in FIG. 6B, FIG. 6B is a cross-sectional view along line A-A shown in FIG. 6A.

As shown in FIG. 6A, the insulating film 30c is provided in a lattice configuration including the multiple voids VB arranged in the X-direction and the Y-direction. The insulating film 30b includes multiple island-like regions arranged in the X-direction and the Y-direction. The void VA surrounds the multiple island-like regions.

The island-like regions of the insulating film 30b are arranged in the X-direction and the Y-direction at the same period as the voids VB of the insulating film 30c, The island-like regions are positioned under the voids VB; and the voids VB are provided at positions shifted in the X-direction and the Y-direction with respect to the island-like regions. The insulating film 30b and the insulating film 30c overlap in the regions between the voids VB and the broken lines shown in FIG. 6A.

As shown in FIG. 6B, the insulating film 30d includes the same island-like regions as the insulating film 30b, The island-like regions of the insulating film 30d are positioned respectively on the voids VB. The island-like regions of the insulating film 30d are positioned above the island-like regions of the insulating film 30b and are shifted in the X-direction and the Y-direction with respect to the voids VB, The void VC surrounds the island-like regions of the insulating film 30d.

Figure 7A:
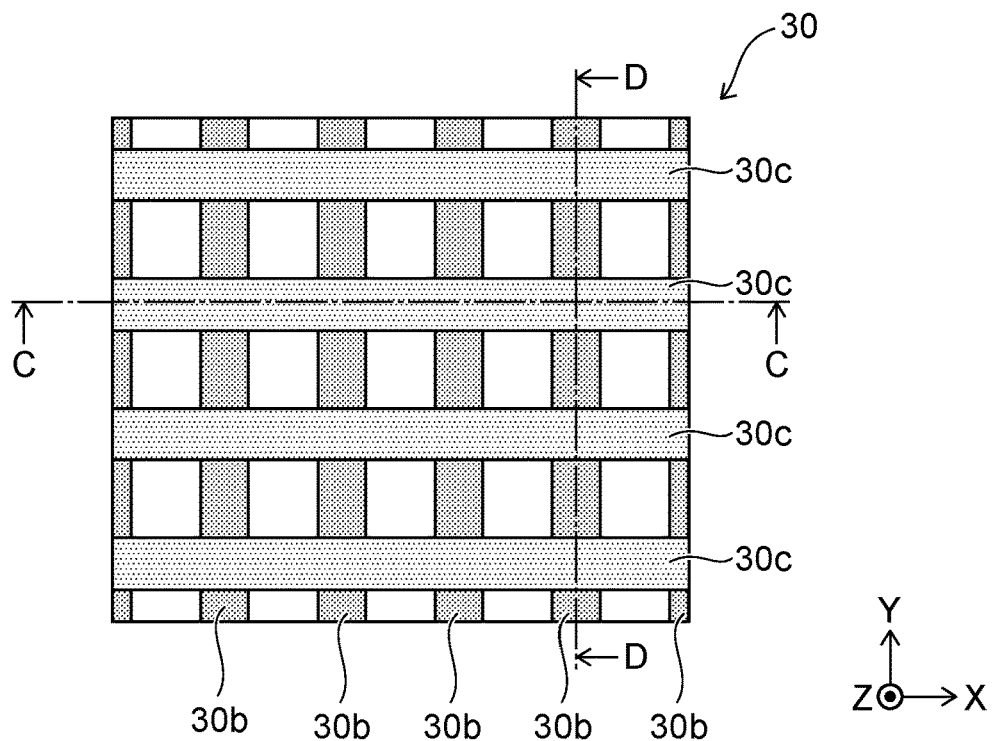
FIGS. 7A to 7C are schematic views illustrating a structure of an insulating portion according to a modification of the first embodiment.
Figure 7B:
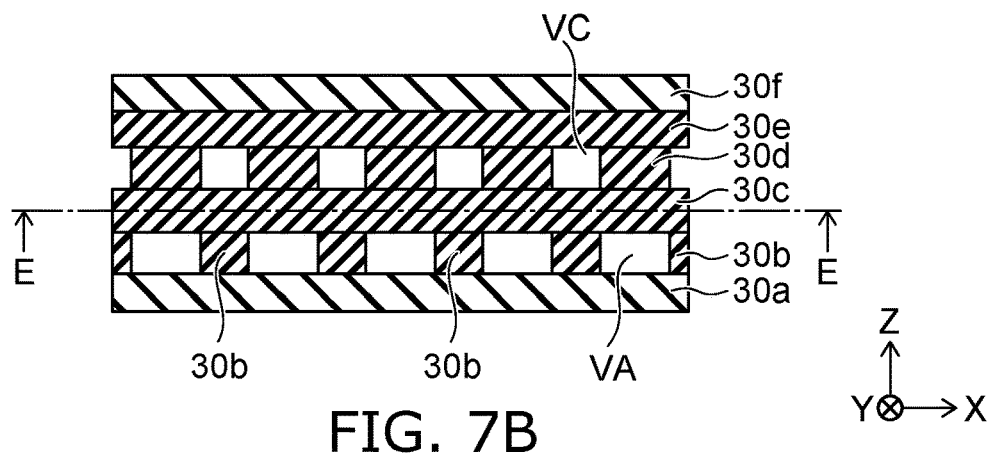
Figure 7C:
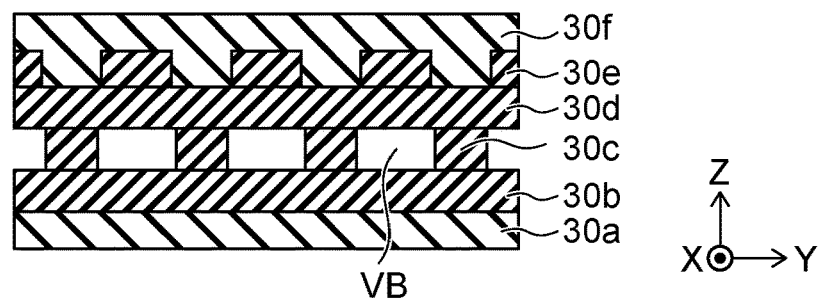

FIGS. 7A to 7C are schematic views illustrating a structure of the second insulating portion 30 according to a modification of the first embodiment, FIG. 7A is a plan view showing a cross section along line E-E shown in FIG. 7B. FIG. 7B is a cross-sectional view along line C-C shown in FIG. 7A. FIG. 7C is a cross-sectional view along line D-D shown in FIG. 7A.

As shown in FIG. 7A, the insulating film 30c includes multiple stripe-shaped regions that extend in the X-direction and are arranged in the Y-direction. The voids VB are provided between the regions of the insulating film 30c next to each other in the Y-direction. The insulating film 30b includes multiple stripe-shaped regions that are below the insulating film 30c, extend in the Y-direction, and are arranged in the X-direction.

As shown in FIGS. 7B and 7C, the voids VA are provided between the stripe-shaped regions of the insulating film 30b that are next to each other. The insulating film 30d includes multiple stripe-shaped regions that are provided on the insulating film 30c, extend in the Y-direction, and are arranged in the X-direction. The voids VC are provided between the stripe-shaped regions of the insulating film 30d that are next to each other. The stripe-shaped regions of the insulating film 30d are positioned respectively above the voids VA. The stripe-shaped regions of the insulating film 30b are positioned respectively below the voids VC.

Figure 8A:
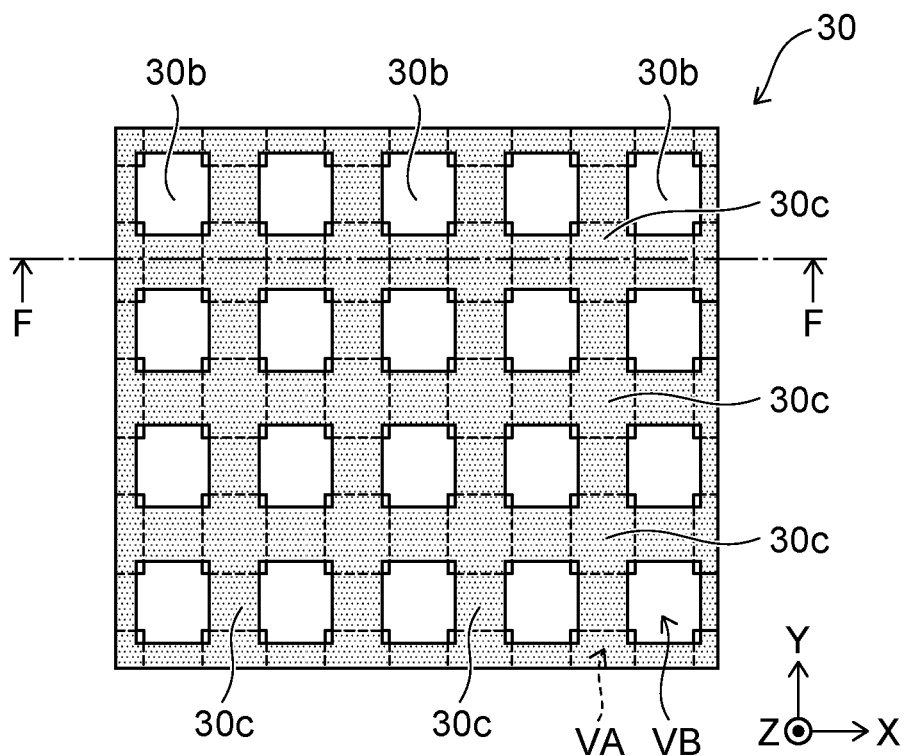
FIGS. 8A and 8B are schematic views illustrating a structure of an insulating portion according to another modification of the first embodiment.
Figure 8B:
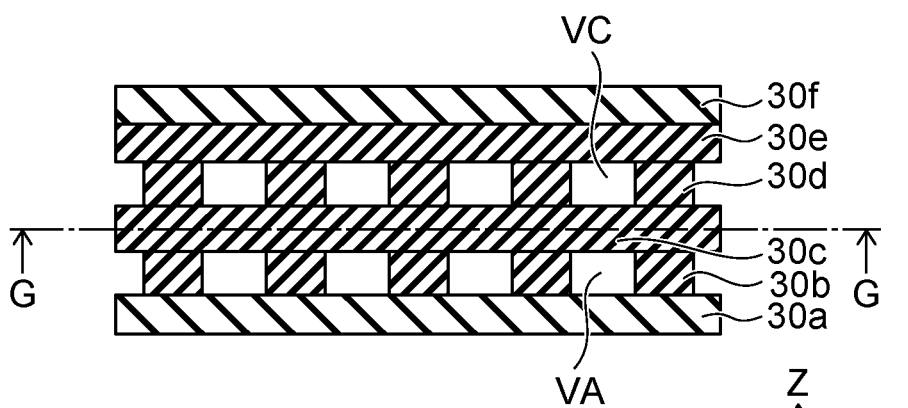

FIGS. 8A and 8B are schematic views illustrating a structure of the second insulating portion 30 according to another modification of the first embodiment, FIG. 8A is a plan view showing a cross section along line G-G shown in FIG. 8B. FIG. 8B is a cross-sectional view along line F-F shown in FIG. 8A.

As shown in FIG. 8A, the insulating film 30c is provided in a lattice configuration that includes the multiple voids VB arranged in the X-direction and the Y-direction. The insulating film 30b is provided in a lattice configuration that includes the multiple voids VA arranged in the X-direction and the Y-direction. For example, each void VA is rectangular, and one of the voids VB overlaps one corner for each of the four corners of the rectangle. The voids VA are positioned below the crossing regions of the lattice-shaped insulating film 30c.

As shown in FIG. 8B, the insulating film 30d is provided in the same lattice configuration as the insulating film 30b; and the voids VC are positioned above the voids VA.

The second insulating portion 30 is not limited to the examples described above. The second insulating portion 30 may include, for example, four or more voids arranged in the Z-direction or two voids arranged in the Z-direction.

Figure 9:
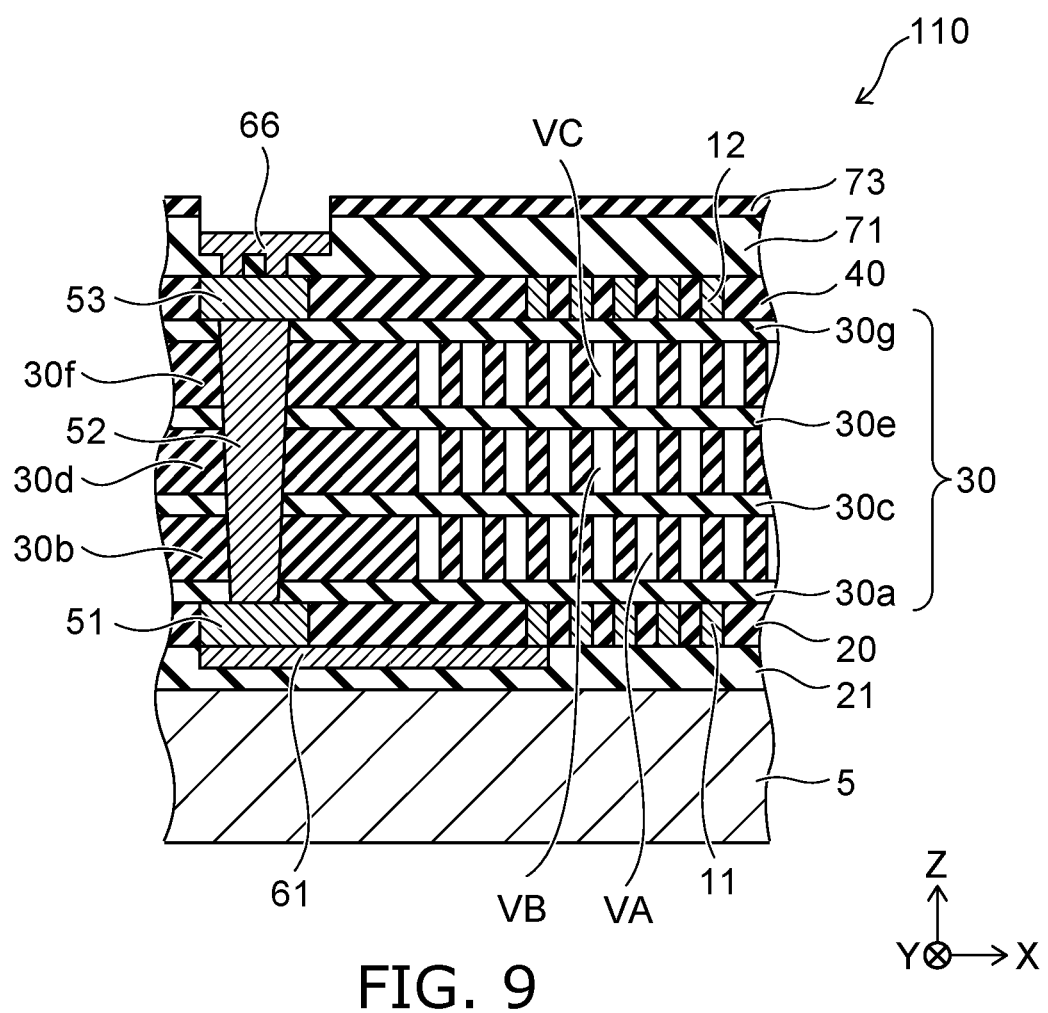
FIG. 9 is a schematic cross-sectional view illustrating an isolator according to a modification of the first embodiment.

FIG. 9 is a schematic cross-sectional view illustrating an isolator 110 according to a modification of the first embodiment. The second insulating portion 30 of the isolator 110 includes the insulating films 30a to 30g stacked in the Z-direction. The insulating films 30b, 30d, and 30f respectively include the voids VA, VB, and VC.

For example, the voids VA, VB, and VC are provided in slit configurations extending in the Y-direction and are arranged in the X-direction.

FIGS. 10A to 10D are schematic cross-sectional views illustrating manufacturing processes of the isolator 110 according to the modification of the first embodiment.

Figure 10A:
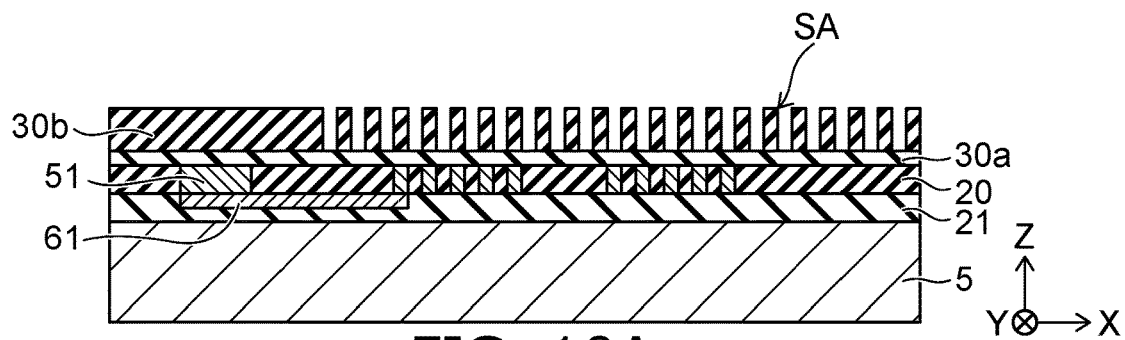
FIGS. 10A to 10D are schematic cross-sectional views illustrating manufacturing processes of the isolator according to the modification of the first embodiment.

As shown in FIG. 10A, the insulating film 30a is provided on the first insulating portion 20. The insulating film 30a is, for example, a silicon nitride film formed by CVD. The insulating film 30a covers the first electrode 11 and the first conductive portion 51.

The insulating film 30b is provided on the insulating film 30a. The insulating film 30b is, for example, a silicon oxide film formed using CVD. The insulating film 30b includes, for example, slit-shaped trenches SA formed by selective removal using an etching mask (not-illustrated). The trenches SA are arranged along the surface of the insulating film 30a and extend in the Y-direction. For example, the insulating film 30b is removed by dry etching; and the insulating film 30a serves as an etching stopper.

Figure 10B:
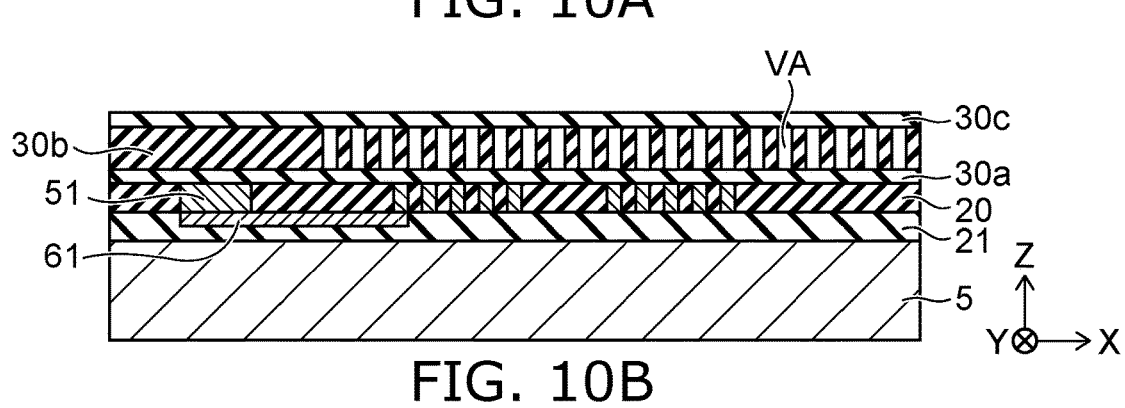

As shown in FIG. 10B, the insulating film 30c is formed on the insulating film 30b. The insulating film 30c is, for example, a silicon nitride film formed by CVD. The insulating film 30c is formed so that the voids VA remain in the insulating film 30b. For example, the insulating film 30c is formed under conditions such that the deposition rate of the insulating film 30c at the openings of the trenches SA is faster than the deposition rate inside the trenches SA.

Figure 10C:
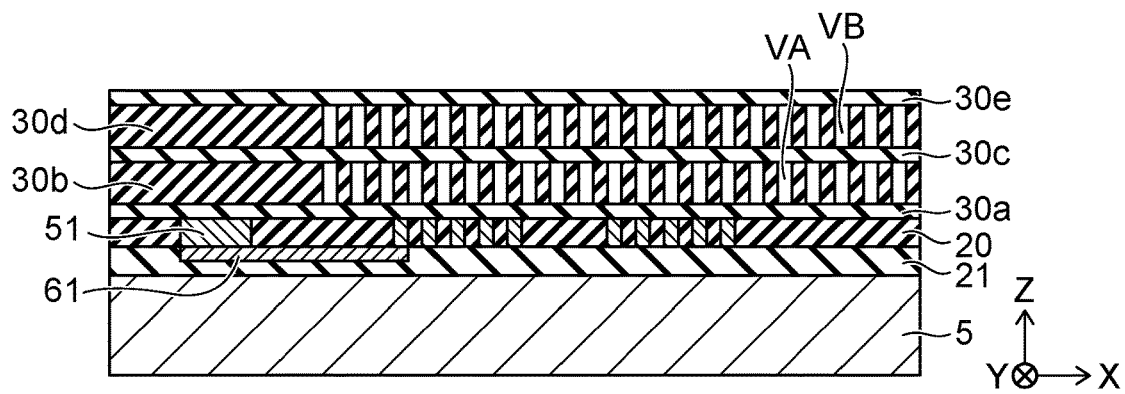
Figure 10D:
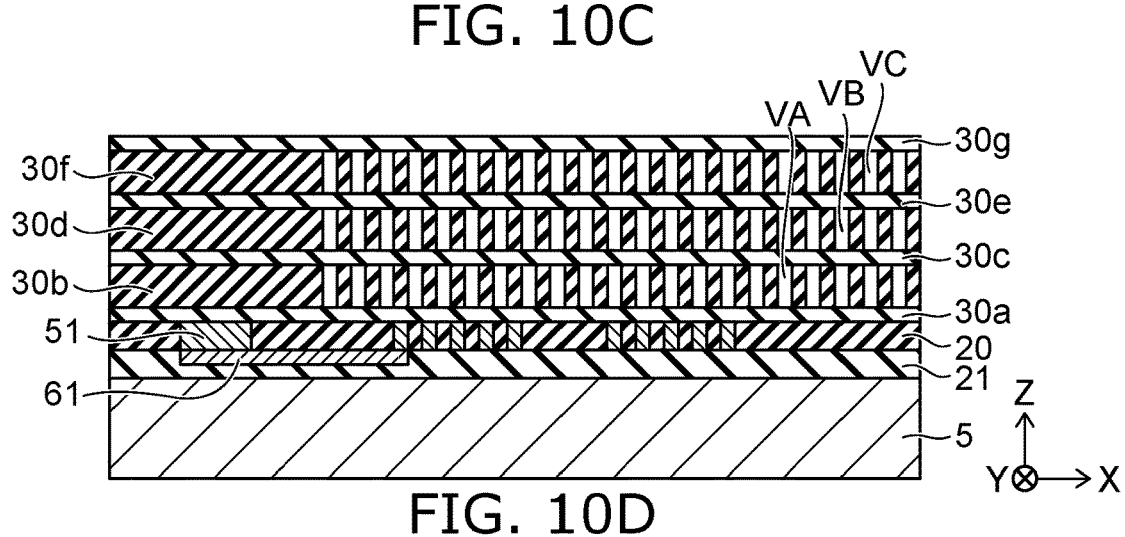

As shown in FIG. 10C, the insulating films 30d and 30e are formed on the insulating film 30c, The insulating film 30d includes the multiple voids VB. The insulating film 30e is formed so that the voids VB remain in the insulating film 30d. The insulating film 30d is, for example, a silicon oxide film formed by CVD. The insulating film 30e is, for example, a silicon nitride film formed by CVD.

As shown in FIG. 103, the insulating films 30f and 30g are formed on the insulating film 30e. The insulating film 30f includes the multiple voids VC. The insulating film 30g is formed so that the voids VC remain in the insulating film 30f. The insulating film 30f is, for example, a silicon oxide film formed by CVD. The insulating film 30g is, for example, a silicon nitride film formed by CVD.

After the second insulating portion 30 that includes the insulating films 30a to 30g is formed, the second conductive portion 52, the third insulating portion 40, the second electrode 12, the third conductive portion 53, etc., are formed, and the isolator 110 is completed (referring to FIG. 9).

In the example, by providing the voids VA, VB, and VC inside the second insulating portion 30, the stress in the insulating body can be reduced, and the cracking, etc., can be prevented. Also, the warp of the wafer can be avoided in the manufacturing processes of the isolator 110.

Second Embodiment

Figure 11:
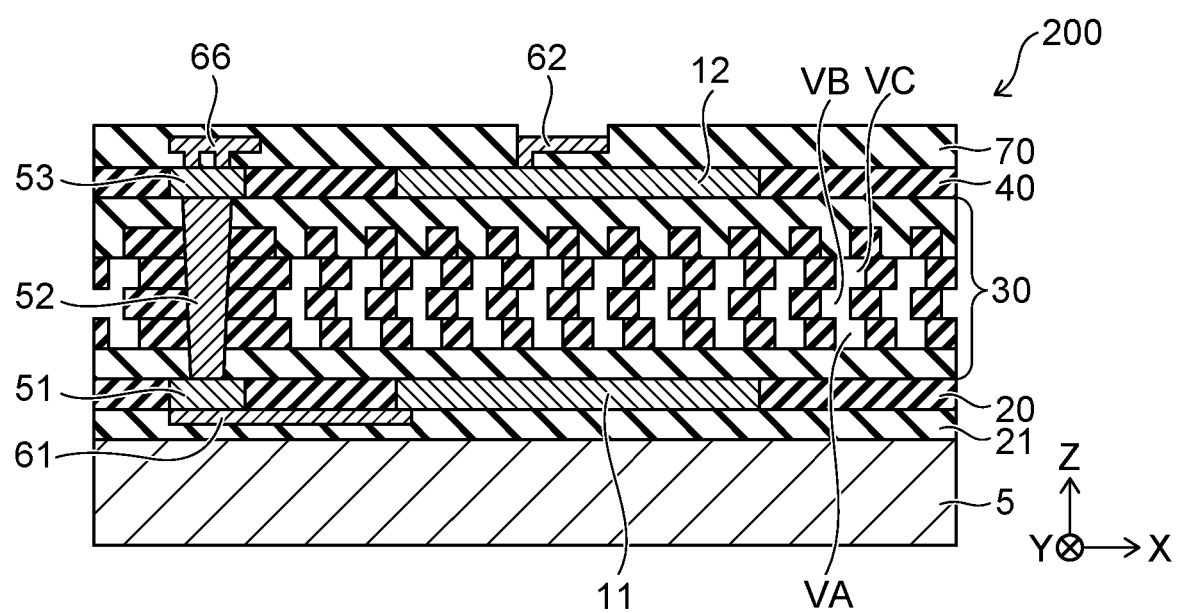
FIG. 11 is a schematic cross-sectional view showing an isolator according to a second embodiment.

FIG. 11 is a schematic cross-sectional view showing an isolator 200 according to a second embodiment. The first and second electrodes 11 and 12 of the isolator 200 each have flat plate shapes and are disposed to face each other. The second insulating portion 30 that is provided between the first electrode 11 and the second electrode 12 includes the voids VA, VB, and VC.

When the isolator 200 is viewed from the Z-direction, the first electrode 11 and the second electrode 12 may be, for example, circular, elliptical, or polygonal. For example, the first electrode 11 and the second electrode 12 are provided so that the upper surface of the first electrode 11 and the lower surface of the second electrode 12 are parallel to each other.

The isolator 200 transmits a signal by utilizing the change of an electric field instead of the change of a magnetic field. Specifically, an electric field is generated between the first electrode 11 and the second electrode 12 when the first circuit 1 applies a voltage to the first electrode 11, In this case, the second circuit 2 detects the electrode-electrode capacitance and generates a signal based on the detection result. Thereby, the signal can be transmitted without passing an electric current between the first electrode 11 and the second electrode 12.

Also, in the example, by providing the voids VA, VB, and VC inside the second insulating portion 30, the stress in the insulating body can be reduced, and the cracking, etc., can be prevented.

Third Embodiment

Figure 12:
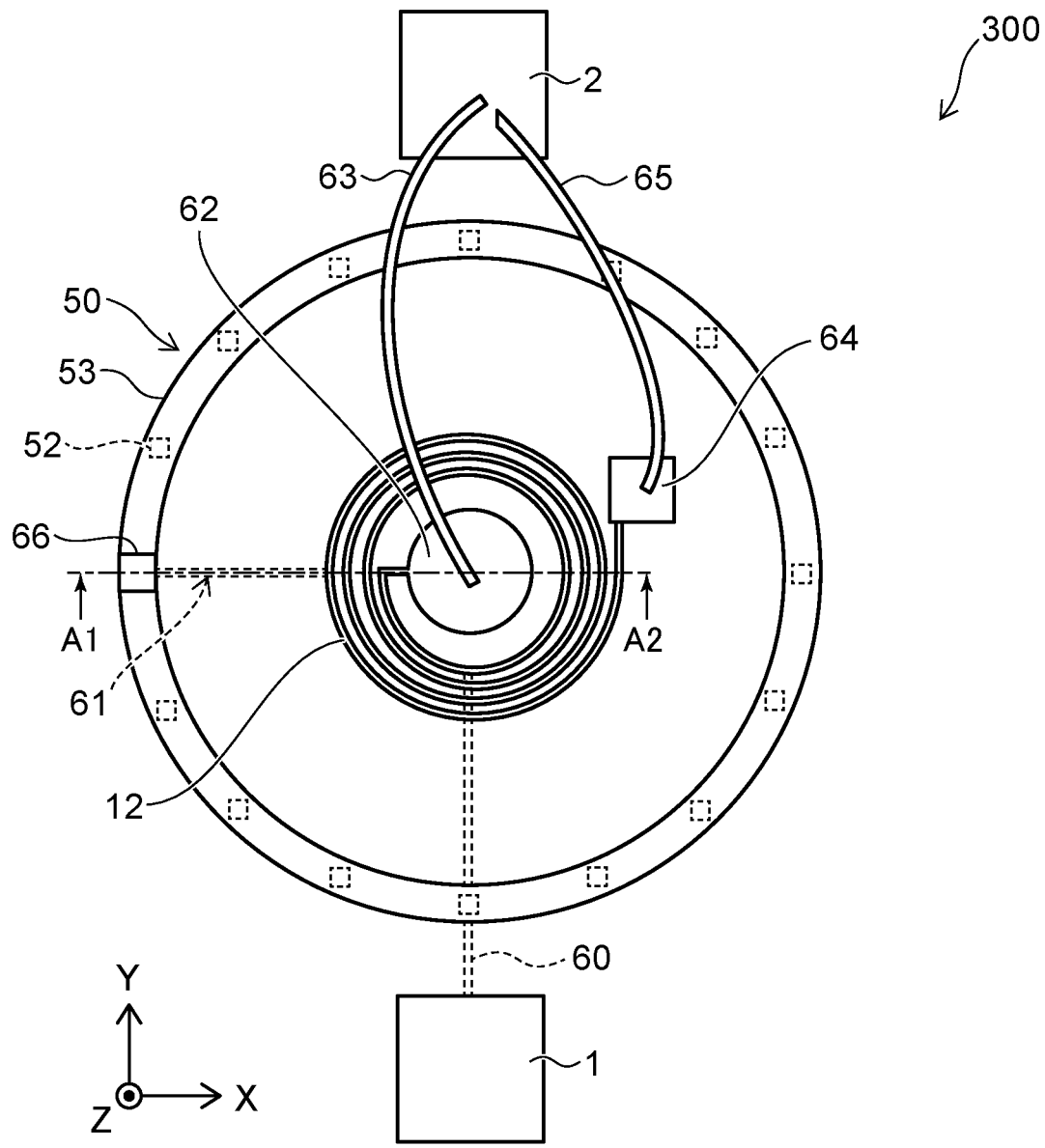
FIG. 12 is a plan view illustrating an isolator, and circuits according to a third embodiment.

FIG. 12 is a plan view illustrating an isolator 300 according to a third embodiment. The isolator 300 has the same planar arrangement as the isolator 100 shown in FIG. 1.

Figure 13:
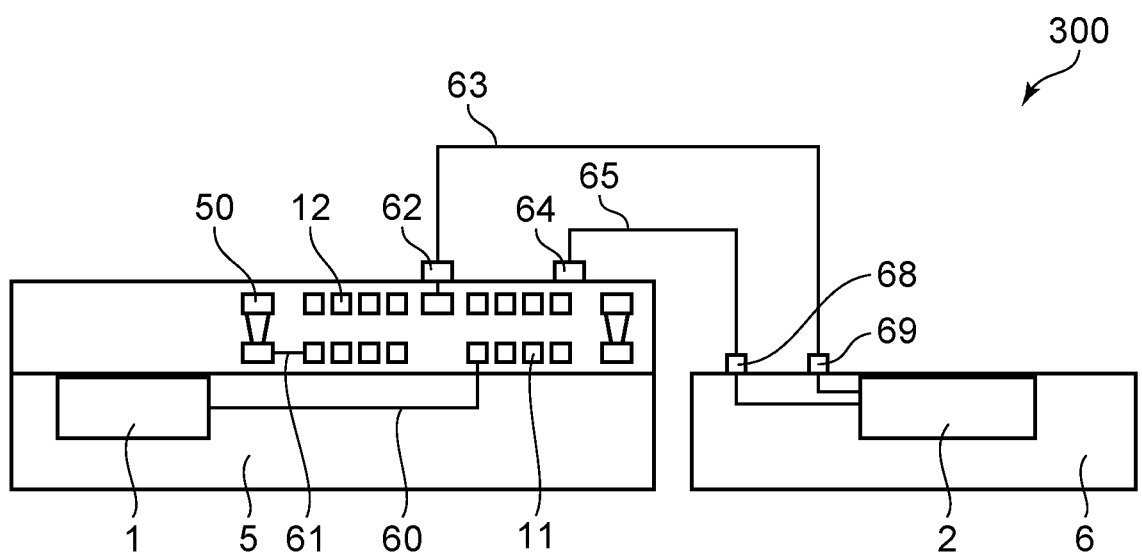
FIG. 13 is a schematic view illustrating the cross-sectional structure of the isolator according to the third embodiment.

FIG. 13 is a schematic view illustrating the cross-sectional structure of the isolator 300 according to the third embodiment.

As shown in FIG. 12, in the isolator 300 according to the third embodiment, one end of the outer perimeter portion of the first electrode 11 is electrically connected to the conductive body 50 via the wiring 61. The other end of the first electrode 11 is electrically connected to the first circuit 1 via the wiring 60.

As shown in FIG. 13, the first circuit 1 is provided in the substrate 5. The second circuit 2 is provided in a substrate 6 that is apart from the substrate 5. The metal layer 62 is electrically connected, via the wiring 63, to a metal layer 69 that is provided on the substrate 6. The metal layer 64 is electrically connected, via the wiring 65, to a metal layer 68 provided on the substrate 6. The metal layers 68 and 69 are electrically connected to the second circuit 2.

In the isolator 300, the structures according to the embodiments described above are applicable for the structures above the substrate 5.

Figure 14:
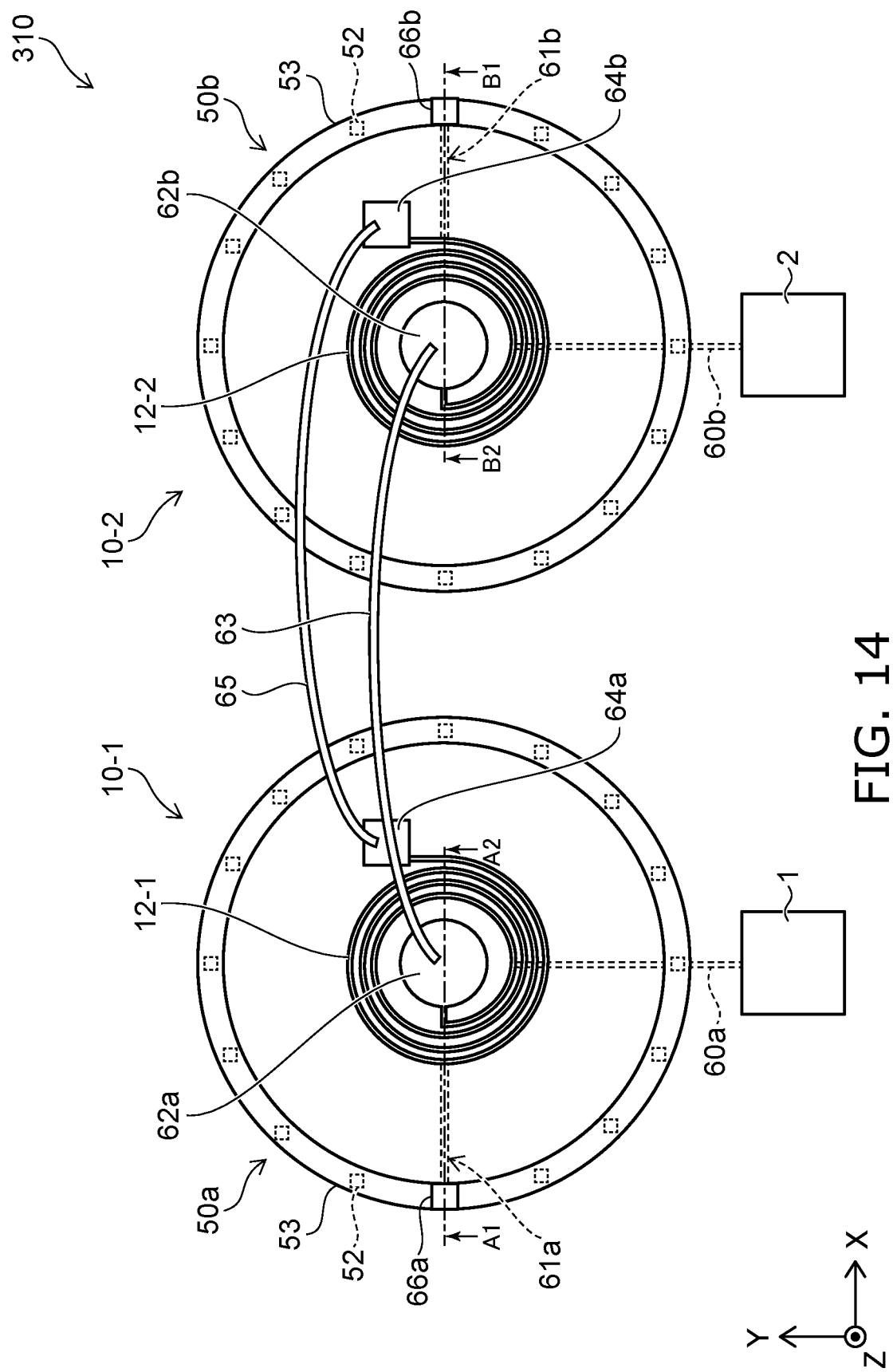
FIG. 14 is a plan view illustrating an isolator, and circuits according to a first modification of the third embodiment.
Figure 15:
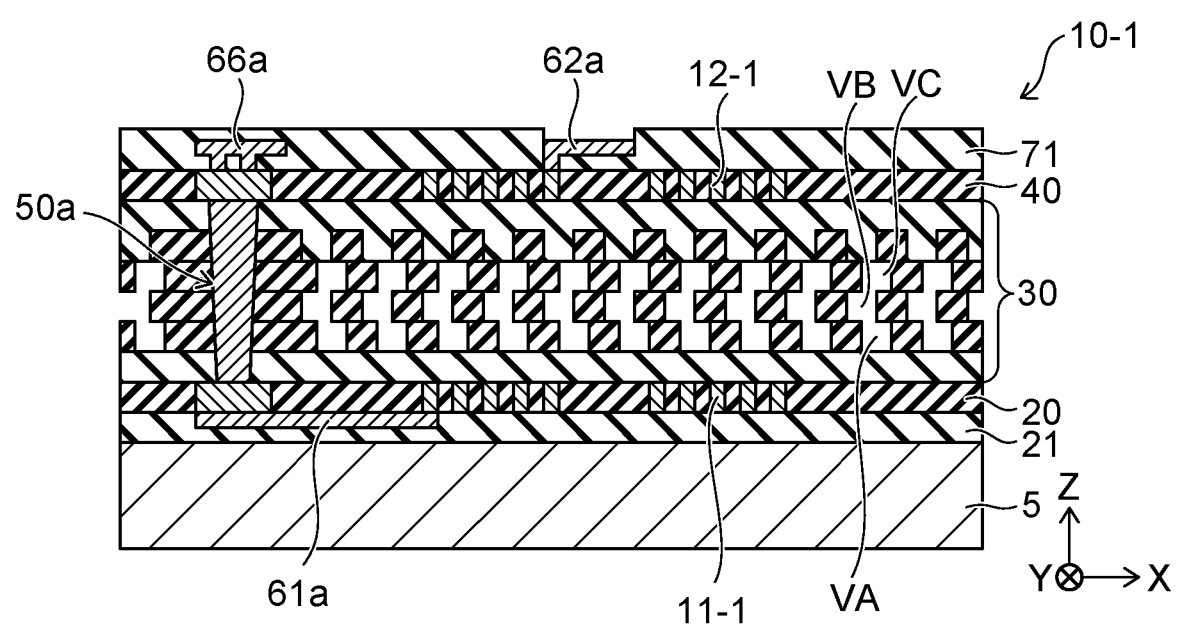
FIG. 15 is an A1-A2 cross-sectional view of FIG. 14.

FIG. 14 is a plan view illustrating an isolator 310 according to a first modification of the third embodiment. FIG. 15 is an A1-A2 cross-sectional view of FIG. 14.

Figure 16:
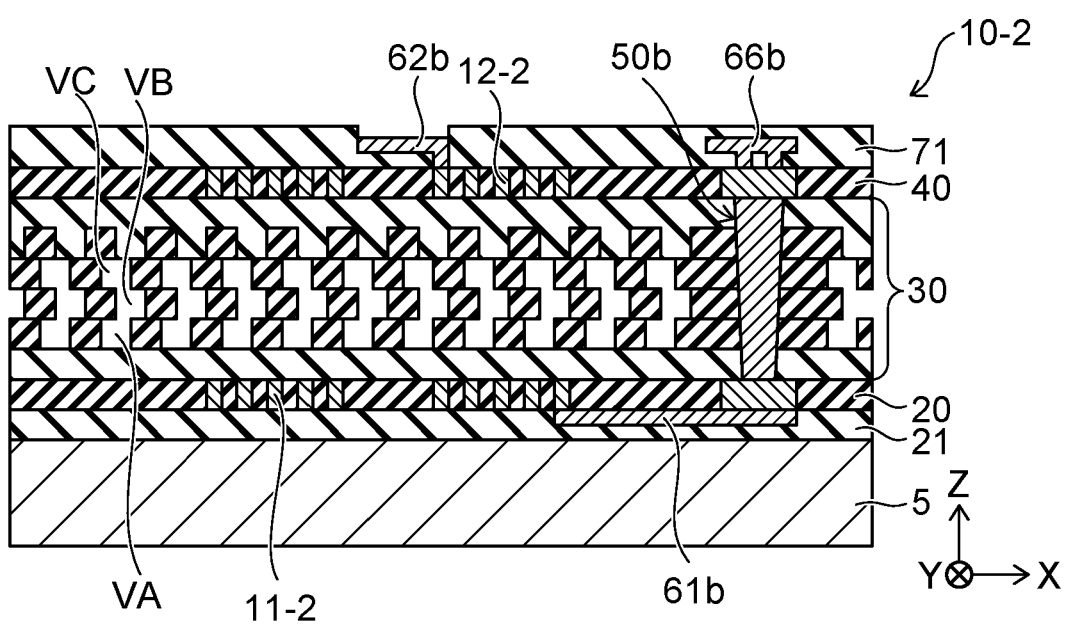
FIG. 16 is a B1-B2 cross-sectional view of FIG. 14.

FIG. 16 is a B1-B2 cross-sectional view of FIG. 14.

Figure 17:
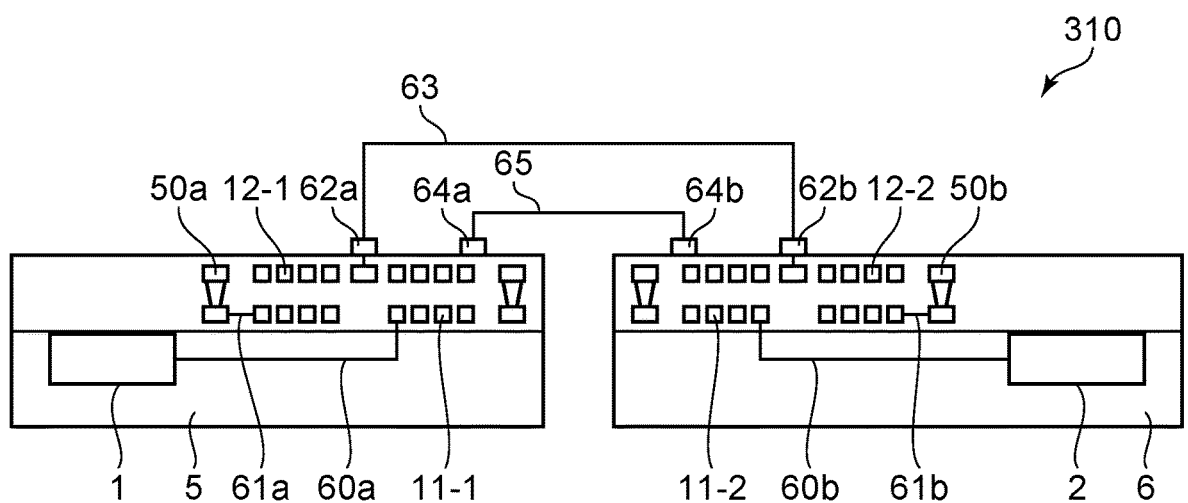
FIG. 17 is a schematic view illustrating the cross-sectional structure of the isolator according to the first modification of the third embodiment.

FIG. 17 is a schematic view illustrating the cross-sectional structure of the isolator 310 according to the first modification of the third embodiment.

As shown in FIG. 14, the isolator 310 according to the first modification includes a first structure body 10-1 and a second structure body 10-2.

As shown in FIGS. 14, 15, and 17, the first structure body 10-1 includes an electrode 11-1, an electrode 12-1, a conductive body 50a, wiring 61a, a metal layer 62a, a metal layer 64a, and a metal layer 66a.

The structures of the electrode 11-1, the electrode 12-1, the conductive body 50a, the wiring 61a, the metal layer 62a, the metal layer 64a, and the metal layer 66a are the same as the structures illustrated in FIG. 2, for example, the structures of the first electrode 11, the second electrode 12, the conductive body 50, the wiring 61, the metal layer 62, the metal layer 64, and the metal layer 66.

As shown in FIGS. 14, 16, and 17, the second structure body 10-2 includes an electrode 11-2, an electrode 12-2, a conductive body 50b, wiring 61b, a metal layer 62b, a metal layer 64b, and a metal layer 66b.

The structures of the electrode 11-2, the electrode 12-2, the conductive body 50b, the wiring 61b, the metal layer 62b, the metal layer 64b, and the metal layer 66b are the same as the structures illustrated in FIG. 2, for example, the structures of the first electrode 11, the second electrode 12, the conductive body 50, the wiring 61, the metal layer 62, the metal layer 64, and the metal layer 66.

The second insulating portions 30 that are provided between the electrode 11-1 and the electrode 12-1 and between the electrode 11-2 and the electrode 12-2 include the voids VA, VB, and VC.

As shown an FIG. 14, the metal layer 62a is electrically connected to the metal layer 62b by the wiring 63. The metal layer 64a is electrically connected to the metal layer 64b by the wiring 65.

The metal layer 66a and the metal layer 66b are electrically connected to other conductive members. The conductive bodies 50a and 50b are connected to other reference potentials respectively via the metal layers 66a and 66b.

As shown in FIG. 17, the first circuit 1 is provided in the substrate 5. The first structure body 10-1 is provided on the substrate 5. The second circuit 2 is provided in the substrate 6. The second structure body 10-2 is provided on the substrate 6. One end of the electrode 11-1 is electrically connected to the conductive body 50a. The other end of the electrode 11-1 is electrically connected to the first circuit 1. One end of the electrode 11-2 is electrically connected to the conductive body 50b. The other end of the electrode 11-2 is electrically connected to the second circuit 2.

In the isolator 310, the structures according to the embodiments described above are applicable for the structure above the substrate 5 and the structure above the substrate 6.

In the isolator 310 illustrated in FIGS. 14 to 17, the pair of the electrodes 11-1 and 12-1 is connected in series with the pair of the electrodes 11-2 and 12-2. In other words, the first circuit 1 and the second circuit 2 are doubly insulated from each other by two pairs of electrodes connected in series. According to the isolator 310, the insulation reliability can be greater than that of a structure singly insulated by one pair of electrodes.

Figure 18:
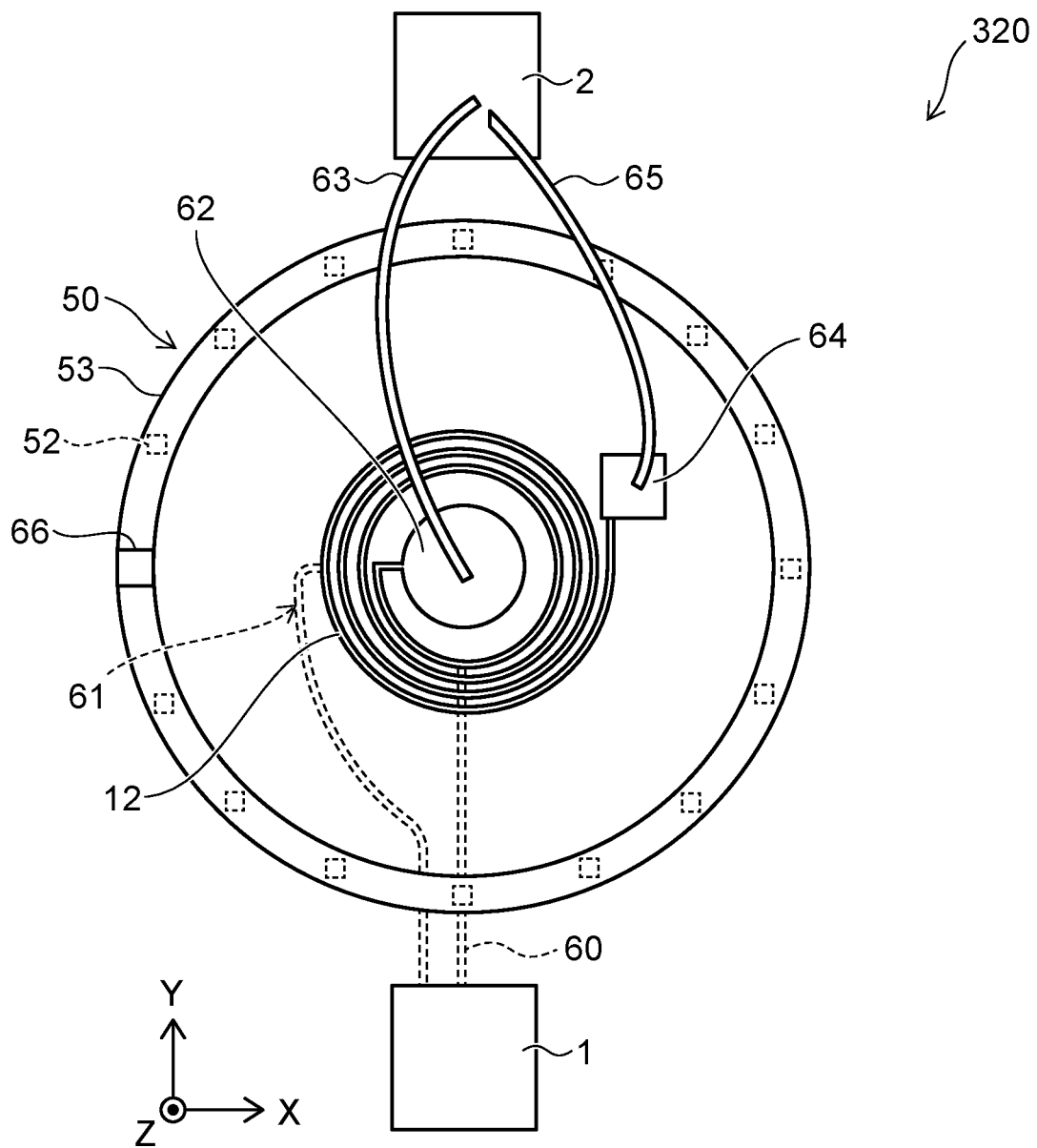
FIG. 18 is a plan view illustrating an isolator, and circuits according to a second modification of the third embodiment.

FIG. 18 is a plan view illustrating an isolator 320 according to a second modification of the third embodiment. The isolator 320 has the same planar arrangement as the isolator 100 shown in FIG. 1 except for the wiring 61.

Figure 19:
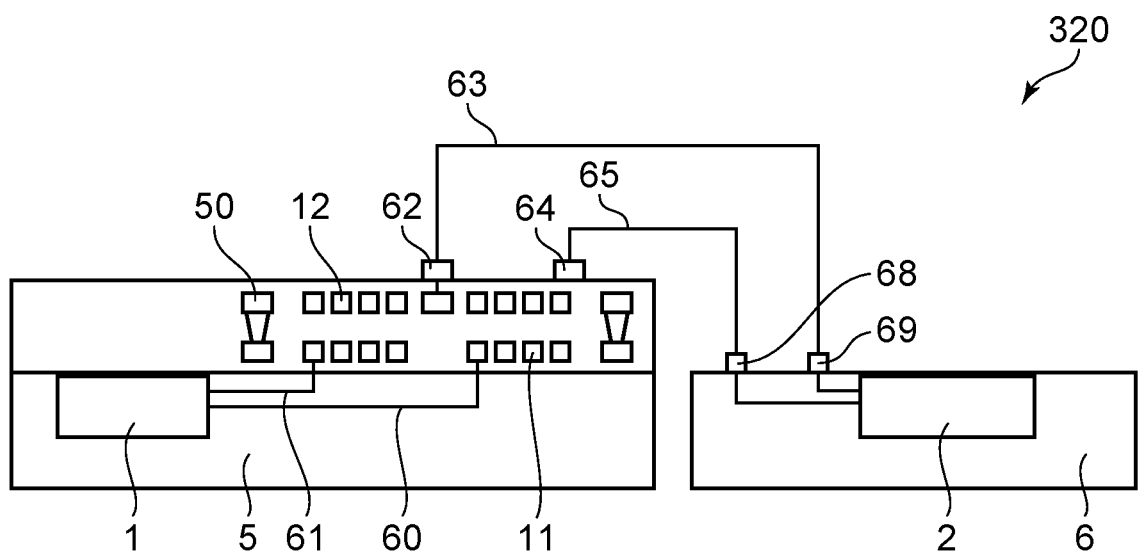
FIG. 19 is a schematic view illustrating the cross-sectional structure of the isolator according to the second modification of the third embodiment.

FIG. 19 is a schematic view illustrating the cross-sectional structure of the isolator 320 according to the second modification of the third embodiment.

As shown in FIGS. 18 and 19, the isolator 320 according to the second modification of the third embodiment differs from the isolator 300 in that the two ends of the first electrode 11 are electrically connected to the first circuit 1. The conductive body 50 is electrically isolated from the first circuit 1 and the first electrode 11. As long as the conductive body 50 is set to a reference potential, the electrical connectional relationship between the first circuit 1, the first electrode 11, and the conductive body 50 can be modified as appropriate.

Figure 20:
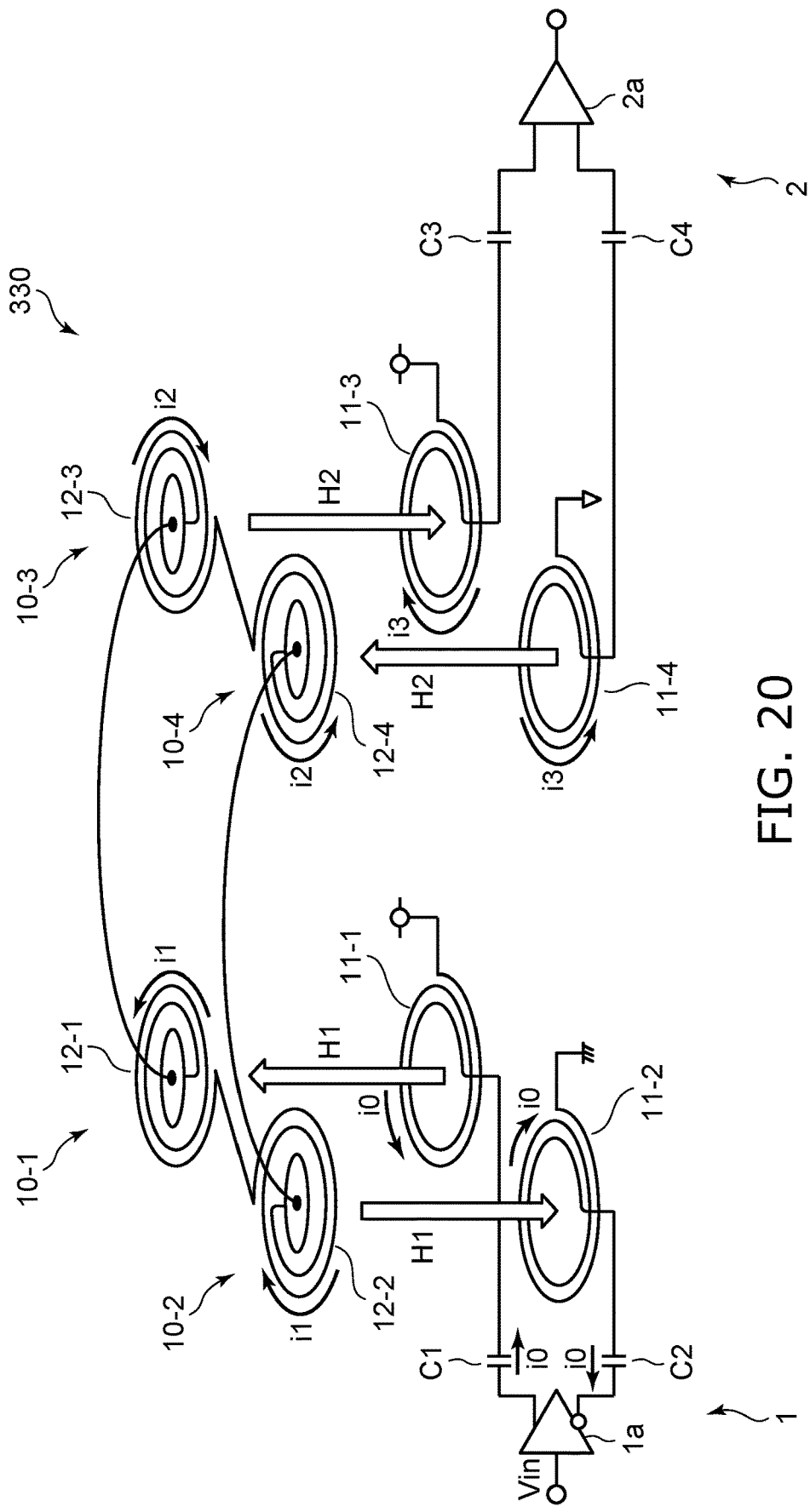
FIG. 20 is a schematic view illustrating an isolator according to a third modification of the third embodiment.

FIG. 20 is a schematic view illustrating an isolator 330 according to a third modification of the third embodiment. The isolator 330 includes the first structure body 10-1, the second structure body 10-2, a third structure body 10-3, and a fourth structure body 10-4. The first structure body 10-1 includes the electrode 11-1 and the electrode 12-1. The second structure body 10-2 includes the electrode 11-2 and the electrode 12-2. The third structure body 10-3 includes an electrode 11-3 and an electrode 12-3. The fourth structure body 10-4 includes an electrode 11-4 and an electrode 12-4. The electrodes each are coils. The first circuit 1 includes a differential driver circuit 1a, a capacitance C1, and a capacitance C2, The second circuit 2 includes a differential receiving circuit 2a, a capacitance C3, and a capacitance C4.

For example, the differential driver circuit 1a, the capacitance C1, the capacitance C2, the electrode 11-1, the electrode 11-2, the electrode 12-1, and the electrode 12-2 are formed on a first substrate (not illustrated). One end of the electrode 11-1 is connected to a first constant potential. The other end of the electrode 11-1 is connected to the capacitance C1, One end of the electrode 11-2 is connected to a second constant potential. The other end of the electrode 11-2 is connected to the capacitance C2.

One output of the differential driver circuit 1a is connected to the capacitance C1. The other output of the differential driver circuit 1a is connected to the capacitance C2. The capacitance C1 is connected to the differential driver circuit 1a and the electrode 11-1. The capacitance C2 is connected to the differential driver circuit 1a and the electrode 11-2.

The electrode 11-1 and the electrode 12-1 are stacked with an insulating portion interposed. The electrode 11-2 and the electrode 12-2 are stacked with another insulating portion interposed. One end of the electrode 12-1 is connected to one end of the electrode 12-2.

For example, the differential receiving circuit 2a, the capacitance C3, the capacitance C4, the electrode 11-3, the electrode 11-4, the electrode 12-3, and the electrode 12-4 are formed on a second substrate (not-illustrated). One end of the electrode 11-3 is connected to a third constant potential. The other end of the electrode 11-3 is connected to the capacitance C3. One end of the electrode 11-4 is connected to a fourth constant potential. The other end of the electrode 11-4 is connected to the capacitance C4.

One input of the differential receiving circuit 2a is connected to the capacitance C3. The other input of the differential receiving circuit 2a is connected to the capacitance C4. The electrode 11-3 and the electrode 12-3 are stacked with an insulating portion interposed. The electrode 11-4 and the electrode 12-4 are stacked with another insulating portion interposed. One end of the electrode 12-3 is connected to one end of the electrode 12-4, The other end of the electrode 12-3 is connected to the other end of the electrode 12-1. The other end of the electrode 12-4 is connected to the other end of the electrode 12-2.

An operation of the isolator 330 will now be described. A modulated signal is transmitted in the isolator 330, In FIG. 20, Vin is the modulated signal. For example, an edge-triggered technique or on-off keying is used to modulate the signal. In any technique, Vin is the original signal shifted toward the high frequency band.

The differential driver circuit 1a outputs an electric current i0 corresponding to V/n, which flows in the electrode 11-1 and the electrode 11-2 in mutually-reverse directions. The electrodes 11-1 and 11-2 generate magnetic fields (H1) having mutually-reverse orientations. When the number of winds of the electrode 11-1 is equal to the number of winds of the electrode 11-2, the magnitudes of the generated magnetic fields are equal.

The induced voltage that is generated in the electrode 12-1 by the magnetic field H1 is added to the induced voltage generated in the electrode 12-2 by the magnetic field H1. An electric current i1 flows in the electrodes 12-1 and 12-2. The electrodes 12-1 and 12-2 are connected respectively to the electrode 12-3 and the electrode 12-4 by bonding wires. The bonding wires include, for example, gold. The diameters of the bonding wires are, for example, 30 μm.

The sum of the induced voltages in the electrodes 12-1 and 12-2 is applied to the electrodes 12-3 and 12-4. An electric current i2 that has the same value as the current i1 flowing in the electrode 12-1 and the electrode 12-2 flows in the electrodes 12-3 and 12-4. The electrodes 12-3 and 12-4 generate magnetic fields (H2) having mutually-reverse orientations. When the number of winds of the electrode 12-3 is equal to the number of winds of the electrode 12-4, the magnitudes of the generated magnetic fields are equal.

The direction of the induced voltage generated in the electrode 11-3 by the magnetic field H2 is the reverse of the direction of the induced voltage generated in the electrode 11-4 by the magnetic field H2. An electric current i3 flows in the electrodes 11-3 and 11-4. The magnitude of the induced voltage generated in the electrode 11-3 is equal to the magnitude of the induced voltage generated in the electrode 11-4. The modulated signal is transmitted by applying, to the differential receiving circuit 2a, the sum of the induced voltages that are generated in the electrodes 11-3 and 11-4.

Fourth Embodiment

Figure 21:
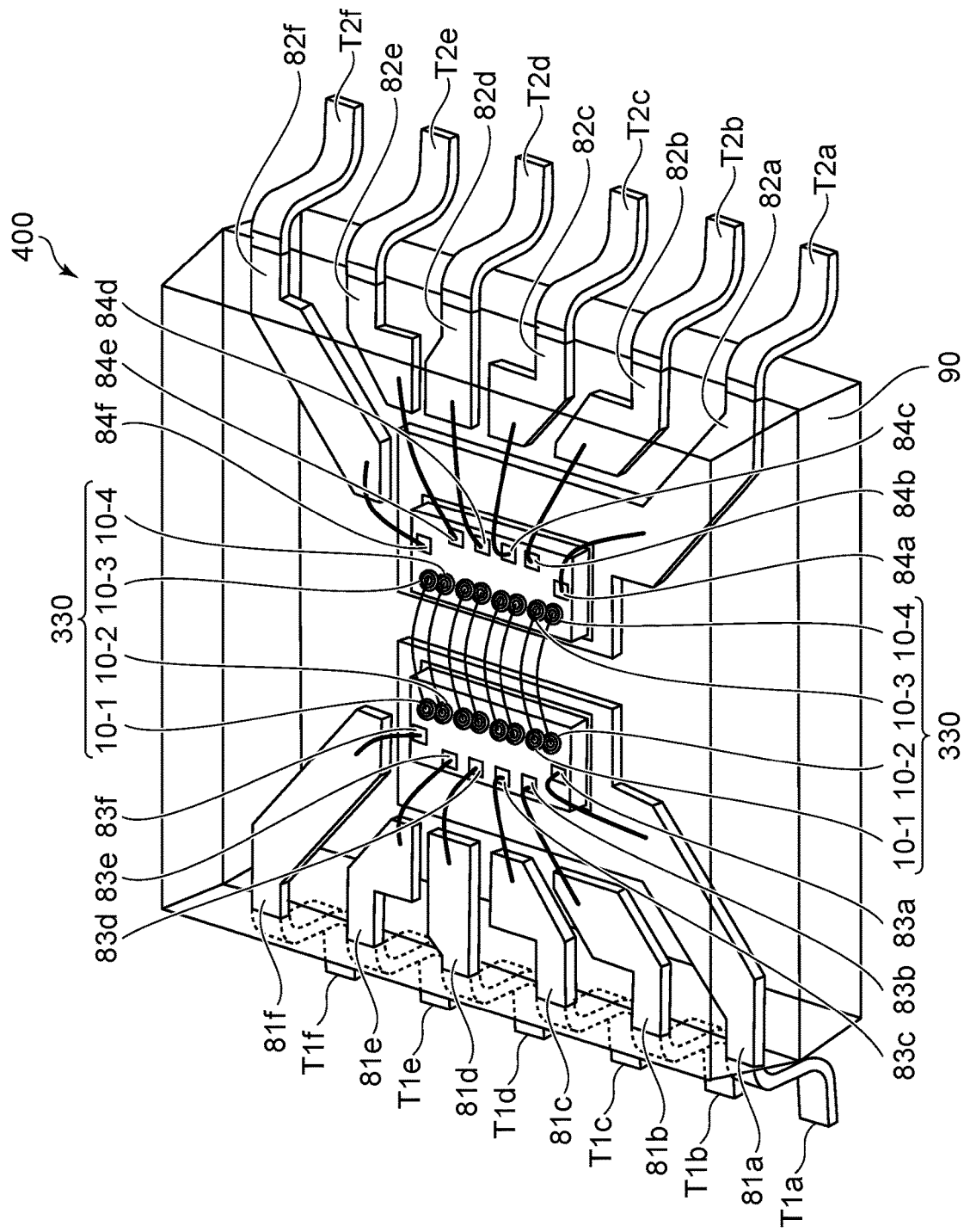
FIG. 21 is a perspective view illustrating a package according to a fourth embodiment.

FIG. 21 is a perspective view illustrating a package 400 according to a fourth embodiment.

Figure 22:
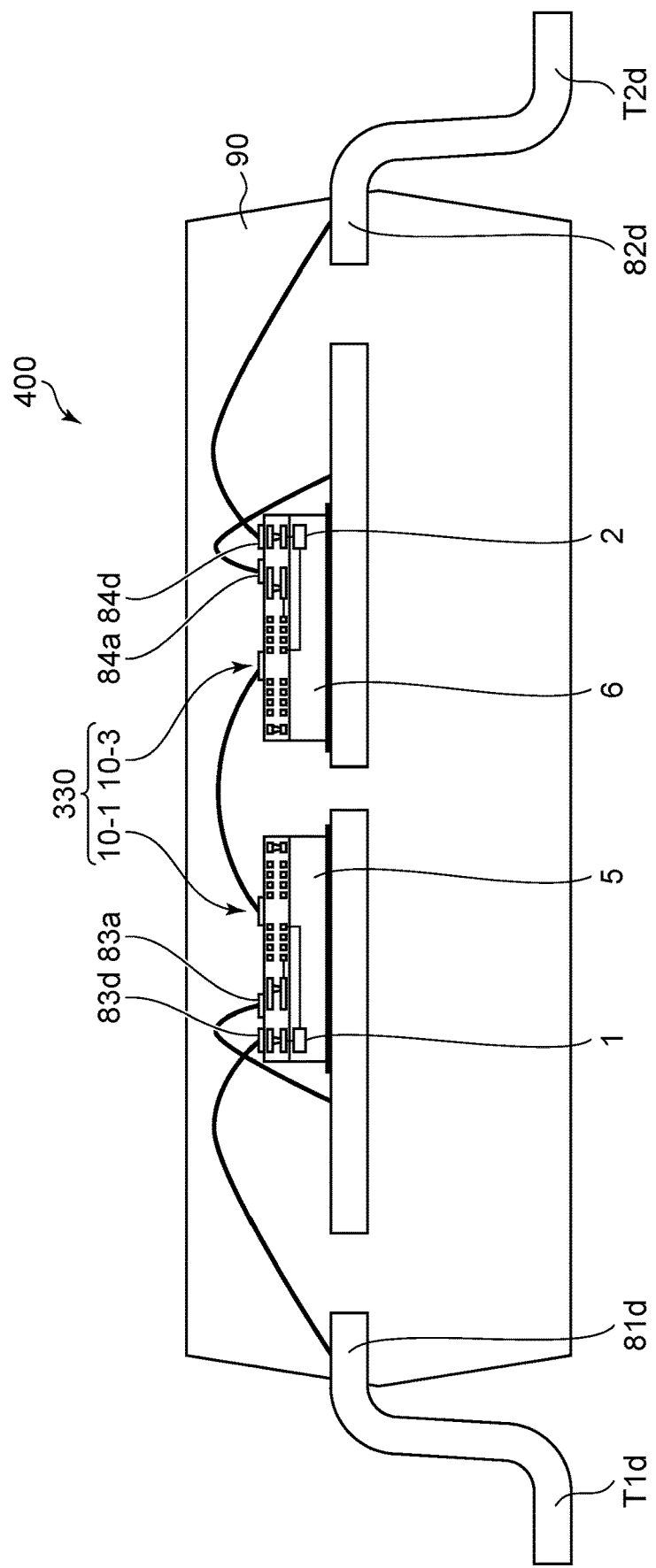
FIG. 22 is a schematic view illustrating a cross-sectional structure of the package according to the fourth embodiment.

FIG. 22 is a schematic view illustrating a cross-sectional structure of the package 400 according to the fourth embodiment.

As shown in FIG. 21, the package 400 according to the fourth embodiment includes metal members 81a to 81f, metal members 82a to 82f, metal layers 83a to 83f, metal layers 84a to 84f, a sealing portion 90, and multiple isolators 330. In the illustrated example, the package 400 includes four isolators 330. In other words, four sets of the first to fourth structure bodies 10-1 to 10-4 illustrated in FIG. 20 are provided.

The multiple first structure bodies 10-1 and the multiple second structure bodies 10-2 are provided on a portion of the metal member 81a. For example, the multiple first structure bodies 10-1 and the multiple second structure bodies 10-2 are provided on one substrate 5. The substrate 5 is electrically connected to the metal member 81a. The first circuit 1 that corresponds to the first and second structure bodies 10-1 and 10-2 is provided in the substrate 5.

The multiple third structure bodies 10-3 and the multiple fourth structure bodies 10-4 are provided on a portion of the metal member 82a, The multiple third structure bodies 10-3 and the multiple fourth structure bodies 10-4 are provided on one substrate 6. The substrate 6 is electrically connected to the metal member 82a, The second circuit 2 that corresponds to the third and fourth structure bodies 10-3 and 10-4 are provided in the substrate 6.

The metal member 81a also is electrically connected to the metal layer 83a. The metal layer 83a is electrically connected to the conductive bodies 50a of the first and second structure bodies 10-1 and 10-2. The metal member 82a also is electrically connected to the metal layer 84a. The metal layer 84a is electrically connected to the conductive bodies 50b of the third and fourth structure bodies 10-3 and 10-4.

Metal members 81b to 81e are electrically connected respectively to metal layers 83b to 83e. The metal layers 83b to 83e are electrically connected to the first circuit 1. The metal member 81f is electrically connected to the metal layer 83f. For example, the metal layer 83f is electrically connected to the first constant potential (referring to FIG. 20).

Metal members 82b to 82e are electrically connected respectively to metal layers 84b to 84e. The metal layers 84b to 84e are electrically connected respectively to the second circuit 2. The metal member 82f is electrically connected to the metal layer 84f. For example, the metal layer 84f is electrically connected to the third constant potential (referring to FIG. 20).

The sealing portion 90 covers the multiple isolators 330, the metal layers 84a to 84f, the metal layers 83a to 83f, and portions of the metal members 81a to 81f and 82a to 82f.

The metal members 81a to 81f respectively include terminals T1a to T1f, The metal members 82a to 82f respectively include terminals T2a to T2f. The terminals T1a to T1f and T2a to T2f are not covered with the sealing portion 90 and are exposed externally.

For example, the terminals Tia and T2a are connected to a reference potential. Signals to the first circuit 1 are input respectively to terminals T1b to T1e, Signals from the second circuit 2 are output respectively to terminals T2b to T2e, The terminal T1f is connected to a power supply for driving the first circuit 1. The terminal T2f is connected to a power supply for driving the second circuit 2.

Although an example is described herein in which four sets of four isolators 330 each are provided in the package 400, one or more other isolators may be provided in the package 400.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the invention.

What is claimed is:

1. An isolator, comprising:
a first insulating portion;
a first electrode provided in the first insulating portion;
a second insulating portion provided on the first insulating portion and the first electrode, the second insulating portion including a plurality of first voids and a second void, the plurality of first voids being arranged in a first direction parallel to an interface between the first insulating portion and the second insulating portion, the first voids being provided under the second void so that the second void is connected to four of the first voids;
a third insulating portion provided on the second insulating portion; and
a second electrode provided in the third insulating portion.

2. The isolator according to claim 1, wherein
the second insulating portion includes:
a third insulating film including the plurality of first voids; and
a fourth insulating film including the second void,
the third insulating film is provided above the first insulating portion and the first electrode, and
the fourth insulating film is provided on the third insulating film.

3. The isolator according to claim 2, wherein
the second insulating portion further includes a fifth insulating film provided between the first insulating portion and the third insulating film, and
the fifth insulating film includes a third void, the at least one of the first voids being provided above the third void, the third void having a same configuration as the second void and communicating with the at least one of the first voids.

4. The isolator according to claim 2, wherein
the second insulating portion includes:
- a sixth insulating film provided on the fourth insulating film; and
- a seventh insulating film provided on the sixth insulating film, and the seventh insulating film includes a portion embedded in the sixth insulating film.

5. The isolator according to claim 1, wherein
the second insulating portion includes:
- a third insulating film extending between the first insulating portion and the third insulating portion; and
- a fourth insulating film extending between the third insulating film and the third insulating portion, the third insulating film includes the plurality of first voids arranged in the first direction, and
the fourth insulating film includes a plurality of island-like regions surrounded with the second void.

6. The isolator according to claim 1, wherein
the second insulating portion further includes a third void provided at a level between a level of the first void and a level of the second void in a third direction from the first insulating portion toward the third insulating portion,
the first to third voids each are rectangular in a cross section of the second insulating portion crossing the third direction, and
the third void is connected to the first and second voids at four corners of the rectangle of the third void.

7. An isolator, comprising:
a first insulating portion;
a first electrode provided in the first insulating portion;
a second insulating portion provided on the first insulating portion and the first electrode, the second insulating portion including a plurality of first voids and a second void, the plurality of first voids being arranged in a first direction parallel to an interface between the first insulating portion and the second insulating portion, at least one of the first voids being provided under the second void and being connected to the second void;
a third insulating portion provided on the second insulating portion;
a second electrode provided in the third insulating portion; and
a first insulating film provided between the second electrode and the second insulating portion, the first insulating film including a different material from a material of the second insulating portion.

8. The isolator according to claim 7, wherein
the plurality of first voids extends in a second direction crossing the first direction, and
the second void extends in the first direction.

9. The isolator according to claim 7, wherein
the first void and the second void are provided in slit configurations extending in a second direction crossing the first direction.

10. The isolator according to claim 7, wherein
the second insulating portion includes:
- a third insulating film including the plurality of first voids; and
- a fourth insulating film including the second void, the third insulating film is provided above the first insulating portion and the first electrode, and
the fourth insulating film is provided on the third insulating film.

11. The isolator according to claim 10, wherein
the second insulating portion further includes a fifth insulating film provided between the first insulating portion and the third insulating film, and
the fifth insulating film includes a third void, the at least one of the first voids being provided above the third void, the third void having a same configuration as the second void and communicating with the at least one of the first voids.

12. The isolator according to claim 10, wherein
the second insulating portion includes:
- a sixth insulating film provided on the fourth insulating film; and
- a seventh insulating film provided on the sixth insulating film, and the seventh insulating film includes a portion embedded in the sixth insulating film.

13. An isolator, comprising:
a first insulating portion;
a first electrode provided in the first insulating portion;
a second insulating portion provided on the first insulating portion and the first electrode, the second insulating portion including a plurality of first voids and a second void, the plurality of first voids being arranged in a first direction parallel to an interface between the first insulating portion and the second insulating portion, at least one of the first voids being provided under the second void and being connected to the second void;
a third insulating portion provided on the second insulating portion; and
a second electrode provided in the third insulating portion, wherein the second insulating portion includes a second insulating film continuously provided between the first electrode and the plurality of first voids.

14. The isolator according to claim 13, wherein
the plurality of first voids extends in a second direction crossing the first direction, and
the second void extends in the first direction.

15. The isolator according to claim 13, wherein
the second insulating portion includes:
- a third insulating film including the plurality of first voids; and
- a fourth insulating film including the second void, the third insulating film is provided above the first insulating portion and the first electrode, and
the fourth insulating film is provided on the third insulating film.

16. The isolator according to claim 15, wherein
the second insulating portion further includes a fifth insulating film provided between the first insulating portion and the third insulating film, and
the fifth insulating film includes a third void, the at least one of the first voids being provided above the third void, the third void having a same configuration as the second void and communicating with the at least one of the first voids.

17. The isolator according to claim 15, wherein
the second insulating portion includes:
- a sixth insulating film provided on the fourth insulating film; and
- a seventh insulating film provided on the sixth insulating film, and the seventh insulating film includes a portion embedded in the sixth insulating film.

18. The isolator according to claim 13, wherein the first void and the second void are provided in slit configurations extending in a second direction crossing the first direction.

\* \* \* \* \*